United States Patent [19]

Eberlein

[11] 4,152,780

[45] May 1, 1979

[54] SPS CCD MEMORY SYSTEM WITH SERIAL I/O REGISTERS

[75] Inventor: Delvin D. Eberlein, Altoona, Wis.

[73] Assignee: Sperry Rand Corporation, New York, N.Y.

[21] Appl. No.: 843,910

[22] Filed: Oct. 20, 1977

[51] Int. Cl.$^2$ ............................................. G11C 11/40
[52] U.S. Cl. ....................................... 365/238; 307/238
[58] Field of Search ......................... 365/238; 307/238

[56] References Cited

U.S. PATENT DOCUMENTS

| 3,772,658 | 11/1973 | Sarlo ................................... | 365/238 |
| 3,953,837 | 4/1976 | Cheek, Jr. ............................ | 365/238 |

*Primary Examiner*—Terrell W. Fears
*Attorney, Agent, or Firm*—Kenneth T. Grace; William E. Cleaver; Marshall M. Truex

[57] ABSTRACT

An organization of serial-parallel-serial (SPS) charged-coupled-device (CCD) memory arrays or blocks into a memory system is disclosed. Each memory block is comprised of an N-bit input register, an N-bit output register, N S-bit parallel registers and an N-bit I/O register. Data is bit-serially entered into the input register at a frequency $F_0$ is bit-parallelly shifted through the parallel registers and simultaneously into the output register and the I/O register at a frequency $F_0/N$. Addressed read data are captured by the I/O register and are circulated continuously therein independently of the recirculation process performed by the output register, input register such that if I/O transfer rates are lower than the allowable refresh frequency of the charged-coupled-devices of the memory block, and if one or more refresh cycles are utilized, the addressed read data always remains available in the I/O register. Data is written into consecutively numerically increasing memory blocks such that a consecutive bit stream of data is loaded into the consecutive stages of the consecutive I/O registers during the read operation. This ensures an uninterrupted consecutive output bit stream of the addressed read data independently of refresh cycle shifting of the stored data bits within the recirculation loop.

14 Claims, 29 Drawing Figures

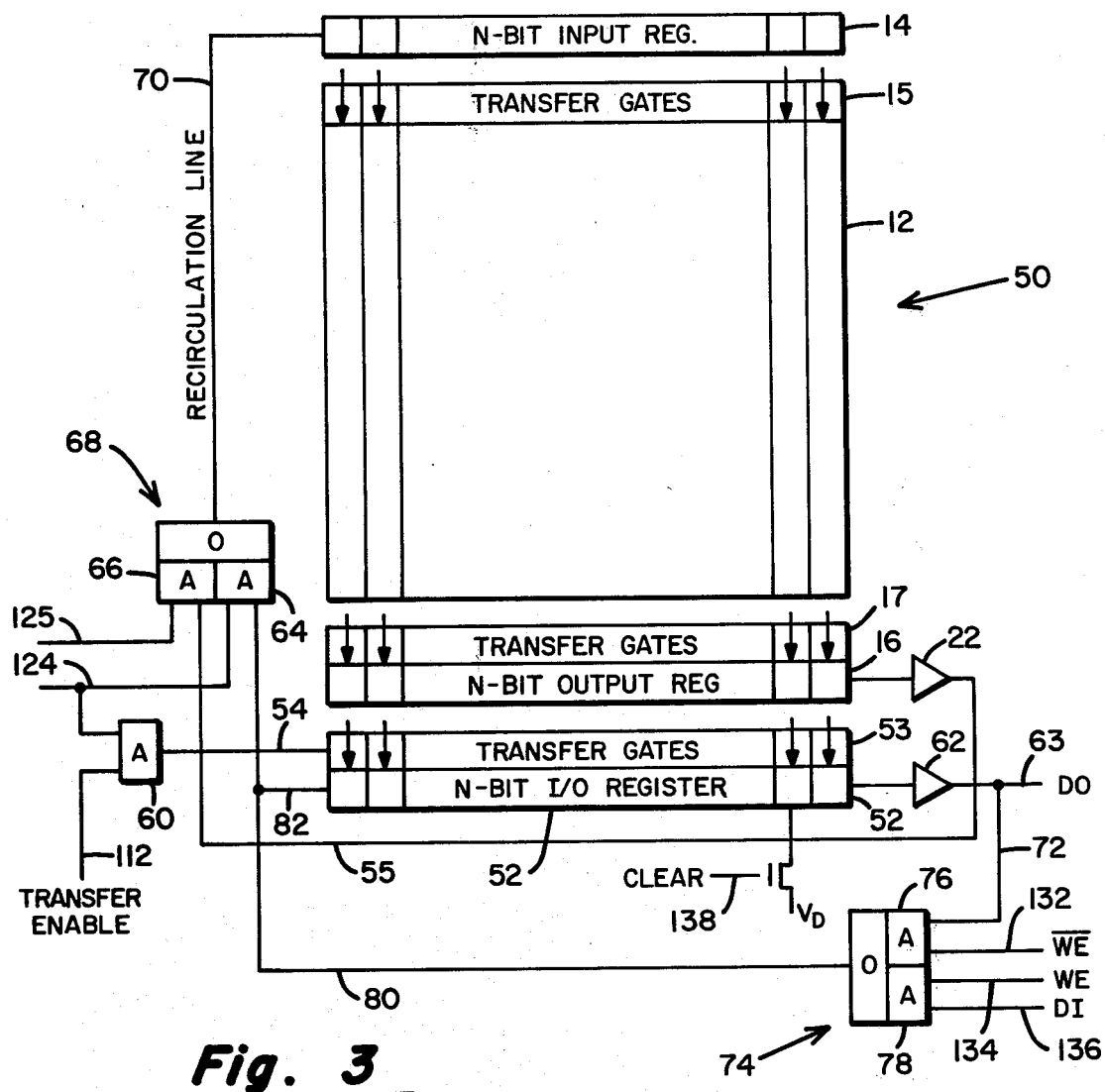
Fig. 3
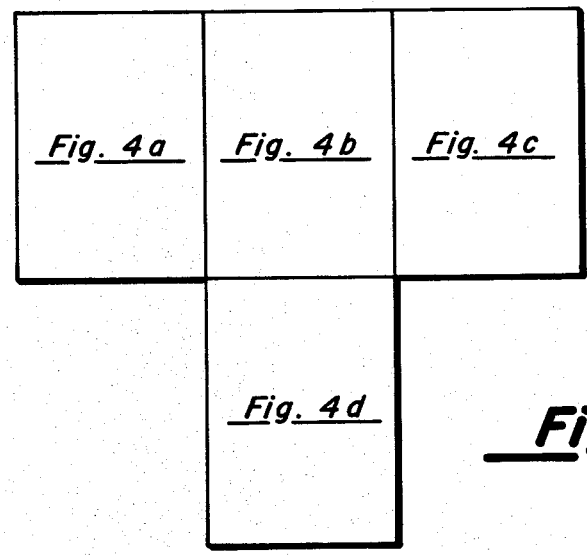
| Fig. 4a | Fig. 4b | Fig. 4c |
Fig. 4d
Fig. 4

TIMING: ASSUME RING COUNTER 56 WAS IN CLEAR STATE

SPS CCD MEMORY SYSTEM WITH SERIAL I/O REGISTERS

BACKGROUND OF THE INVENTION

Serial-parallel-serial charged-coupled-device memory arrays or blocks have been discussed in the literature for several years—see the article "CCD and Photo Sensitive Devices", D. R. Collins, et al, 1973 IEEE International Solid-State Circuits Conference, pages 136, 137. Subsequent improvements to the memory block configuration—see the D. M. Erb U.S. Pat. No. 3,913,077—and to the configuration of a plurality of memory blocks—see the D. K. Goyal U.S. Pat. No. 3,942,163—have also been proposed in the patent literature. The present invention is an improvement invention of this prior art and proposes a novel memory block configuration and a novel configuration of a plurality of such memory blocks.

SUMMARY OF THE INVENTION

An organization of serial-parallel-serial (SPS) charged-coupled-device (CCD) memory blocks is disclosed. Each memory block is comprised of: N serial-shift parallel registers of S bits in length; a serial-shift input (I) register of N bits in length; a serial-shift output (O) register of N bits in length; and, a serial-shift input-/output (I/O) register of N bits in length. Bits of N bit slices are entered into the first stage of the input register at a first clock signal of frequency $F_0$. At a second clock signal of frequency $F_0/N$ the fully loaded input register, i.e., the N bits of the first slice, has its contents shifted bit-parallelly into the first stages of the N parallel registers—the N bits of the first and successive slices are shifted bit-parallelly through the S stages of the N parallel registers after S cycles of the second clock signal. At the S+1 cycle of the second clock signal, the N bits of the first slice, which are now in the Sth stages of the N parallel registers, are transferred bit-parallelly into the like-ordered stages of the output register and the I/O register. The output register is utilized to provide a means for receiving the bit-parallel output of the N parallel registers, i.e., a slice, and bit-serially transferring the received N bits of the slice back to the input register for recirculating through the S parallel registers. The I/O register is utilized to provide a means for capturing and holding the bit-parallel output of the N parallel registers for a read, write or read, modify write operation independent of the recirculation process.

The memory system is comprised of B memory blocks which are addressed by an addressing means including an addressable ring counter. Data blocks, or blocks of data that are to be stored in or read out of the B memory blocks of the memory system, may be comprised of a plurality of data bits that are formed into a plurality of slices. The number of slices in any data block is limited to B for precluding overflow into the beginning of the data block while each consecutive slice of the data block is stored in consecutively numerically decreasing addresses in consecutively numerically increasing memory blocks.

When a data block is to be read out, the address of the first bit of the read data block is coupled to an addressing means that:
specifies the one of the B memory blocks in which the first bit lies;
specifies the one of the S+1 slices of the one of the B memory blocks in which the first bit lies;
specifies the one of the N bit positions in the one of the S+1 slices of the one of the B memory blocks in which the first bit lies.

The addressing means is then set to the number of cycles of the first clock signal that is required to circulate the first bit into the last bit position or stage of the I/O register of the addressed one of the B memory blocks in which the first bit lies. Memory control means then shifts the bits of the read data block out of the addressed I/O register. If the read data block is of a length that is greater than N, i.e., longer than a slice or the number of stages in an I/O register, the consecutive bits of the read data block are bit-serially read out of the I/O registers of consecutively numerically increasing memory blocks at the first clock signal frequency until all the bits of the read data block have been read out of the memory system.

Writing into the memory system is accomplished in a similar addressing procedure. If there is no intervening refresh cycle during a write operation, the first and successive bits of the write data block are simultaneously entered into the first stages of both the I/O register and the input register of the addressed one of the B memory blocks, with any overflow, i.e., any bits of the write data block exceeding N, or the number of bits in a slice, being entered in a similar fashion into the I/O register(s) and the input register(s) of the consecutively numerically increasing memory block(s). After there has been an intervening refresh cycle during a write operation, e.g., after d write data bits of a slice have been written in the I/O register, the d bits of the write data block that have been entered into the I/O register are circulated, in an end-around fashion for N-1 positioning clock pulses during a positioning operation, through the I/O register until the bit location of the first intervening refresh cycle is positioned at the last or right-most stage of the I/O register. During this positioning operation, the circulating d write data bits and the N-d read data bits of the slice in the I/O register are not entered into the input register; however, the input register, the parallel registers and the output register are cycled to effect the positions of the data bits that are stored therein causing the writing of N-d "empty" bits therein. After completion of the positioning operation, the next successive N-d bits of the slice of the write data block, which bits are to be written into the I/O register after the intervening refresh cycle, are coupled bit-serially into the first or left-most stage of the I/O register. After completion of the write operation and all the write data bits of the write data block have been stored in the memory blocks, the write data bits that have been saved in the I/O register(s) due to an intervening refresh cycle are stored in the input register filling the "empty" bit positions. These "saved" write data bits are coupled to the first or left-most stage of the input register(s) at the first clock signal frequency F and are then shifted bit-parallelly through the N S-bit parallel registers at the second clock signal frequency F/N in an uninterrupted continuous manner regardless of the number of intervening refresh cycles that occurred in the first writing.

BRIEF DESCRIPTION OF THE DRAWINGS

FIG. 3 is a block diagram of the SPS CCD memory block of the present invention.

DESCRIPTION OF THE PREFERRED EMBODIMENT

Figure 1:
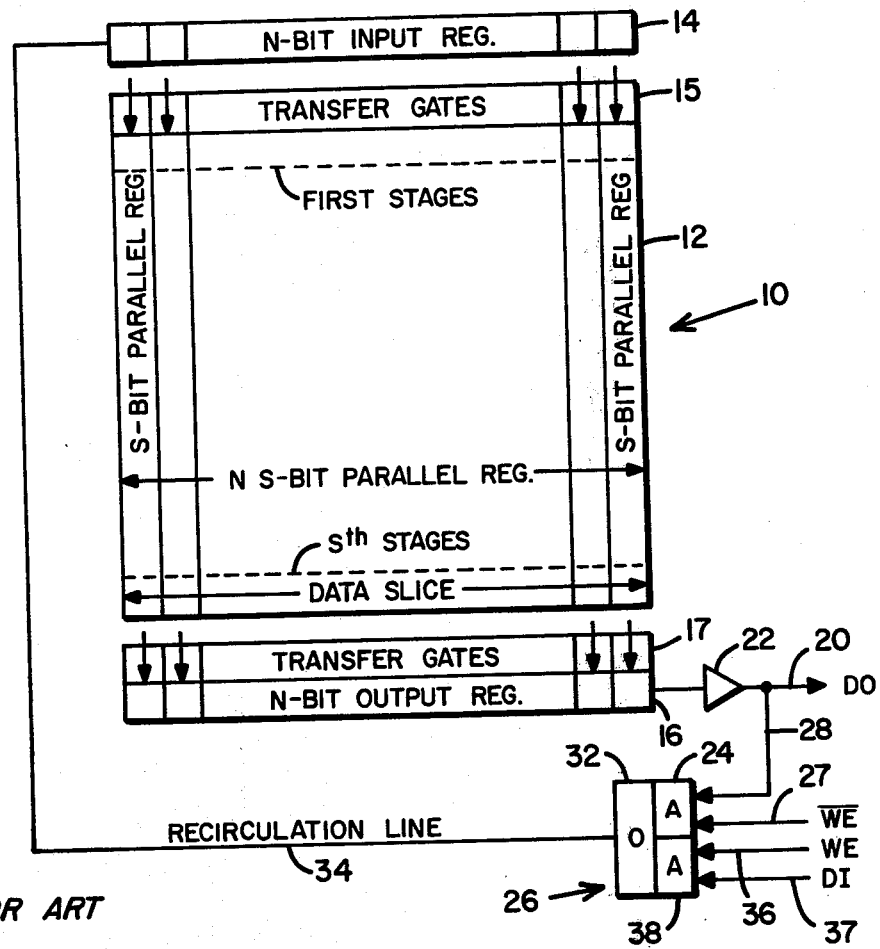
FIG. 1 is a block diagram of a basic prior art SPS CCD memory block.

To best illustrate the subject matter of the present invention there is provided in FIG. 1 a block diagram of a prior art SPS CCD memory block of which the SPS CCD memory block of the present invention, as illustrated in FIG. 3, is an improvement. With respect to the prior art SPS CCD memory block 10 of FIG. 1, memory block 10 is comprised of a plurality of serial-shift binary registers each formed of a plurality of charged-coupled-devices—see the publication "Basic Concepts of Charged-Coupled-Devices", W. F. Kosonocky, et al, RCA Review, Volume 36, Setpember 1975, pages 566–593, and the D. M. Erb U.S. Pat. No. 3,913,077 for a discussion of such charged-coupled-devices and their configuration and operation as serial-shift registers and serial-parallel-serial memory blocks.

Memory block 10 is comprised of N serial-shift parallel registers 12 of S-bits in length, a serial-shift input register 14 of N-bits in length, and a serial-shift output register 16 of N-bits in length. Also included are a plurality of input transfer gates 15 for coupling each of the N-bits of the input register 14 to each of the corresponding N first stages of the N S-bit parallel registers 12. Further included are a plurality of output gates 17 for coupling each of the N-bits that are held in the last, i.e., the Sth, stages of the N S-bit parallel registers 12 to each of the corresponding stages of the N-bit output register 16.

The N-bits of data that are bit-serially loaded into input register 14 and that are bit-parallelly transferred into the corresponding first stages of the N S-bit parallel registers 12 and thence bit-parallelly shifted through the S stages of the N parallel registers 12 are defined as a data slice or more simply a slice. The memory block 10 then is seen as having a capacity of S+1 slices, each slice containing N bits of data, that are formed of the input register 14 and the S stages of the N S-bit parallel registers 12.

Bits of the N-bit slices are bit-serially entered into the first stage of the input register 14 at the first clock signal of frequency $F_0$. At a second clock signal of frequency $F_0/N$, which second clock signal of frequency $F_0/N$ may be generated internally by the memory block 10 from and is synchronized with the first clock signal of frequency $F_0$, the fully loaded input register 14, i.e., the N-bits of the first slice, has its contents shifted bit-parallelly into the first stages of the N parallel registers 12 via transfer gates 15. The N-bits of the first and successive slices which are bit-serially entered into input register 14 at the first clock signal of frequency $F_0$, are shifted bit-parallelly through the S stages of the N parallel registers 12 at the second clock signal of frequency $F_0/N$. At the S+1 cycle of the second clock signal of frequency $F_0/N$, the N-bits of the first slice, which bits of the first slice are now in the Sth stages or the last stages of the N parallel registers 12, are transferred bit-parallelly into the like-ordered stages of the output register 16 via transfer gates 17.

The output register 16 is utilized to provide a means for receiving the bit-parallel output of the N parallel registers 12, i.e., a slice, the bits of which slice are bit-serially coupled to the Data Out (DO) line 20 via charge sensor 22. The bit-serial stream of the data bits on Data Out line 20 are also coupled to AND 24 of AND/OR 26 via line 28. If the data bits on line 28 are to be rewritten into, i.e., recirculated through, memory block 10, a Hi Write Enable ($\overline{WE}$) signal on line 27 enables AND 24 such that the data bit stream, via OR 32 and recirculation line 34, is coupled back to the first stage of input register 14. In this recirculation mode, the data bits are recirculated through memory block 10 at a maximum frequency F, if the memory system is operated at maximum speed.

As is well known, charged-coupled-devices are volatile memory devices that store the binary data as two different levels of electrical charges. These levels of electrical charges may vary with time so as to cause the loss of stored data. Accordingly, such charged-coupled-devices must be operated, i.e., subjected to at least N(S+1) shift-enabling pulses, during a predetermined period of time which predetermined period of time is determined from the maximum period of time that a static charged-coupled-device may reliably hold its electrical charge within known permissable limits. This period of time is defined as the refresh period of $1/F_R$ having the minimum Refresh signal frequency $N(S+1)F_R$. That is, if the data that are stored in memory block 10 are not subjected to an I/O operation, i.e., a read, write, or read, modify write operation, at least once every refresh period of $1/N(S+1)F_R$, a Refresh signal pulse, generated internally to the memory system, must be coupled to memory block 10 to shift the data bits in memory block 10 one stage.

From an inspection of memory block 10 of FIG. 1, it can be seen that refresh of the charge packet—the electrical charge in each bit position that represents a stored datum bit —occurs only when the charge-packet-representing-bit is shifted out of the right-most bit position of output register 16 and is sensed by charge sensor 22. Charge sensor 22 refreshes the sensed bit and then couples the refreshed bit back into the left-most bit position of input register 14. The refreshed bit must then be bit-serially shifted into the input register 14 at the frequency $F_0$, bit-parallelly shifted through a parallel register 12 at the frequency $F_0/N$ into and through to the right-most bit position of output register 16 at the frequency $F_0$. The maximum allowable time to be thus shifted through memory block 10 is the refresh time of $1/F_R$. The number of first clock signal cycles of frequency $F_0$ that is required to shift a bit through memory block 10 in the refresh time of $1/F_R$ is N(S+1) for a minimum Refresh signal frequency of $N(S+1)F_R$.

Therefore a refresh operation must be performed whenever the delay between two consecutive I/O operations is equal to or exceeds $1/N(S+1)F_R$.

As long as memory block 10 is in the recirculation mode, i.e., with Write Enable (WE) signal on line 27 held Hi, and the Write Enable (WE) signal on line 36 held Lo, the data bits that are stored in memory block 10 will be recirculated therethrough in a continuous and reliable manner by a Refresh signal at a frequency $N(S+1)F_R$. As is well known, this movement or recirculation of the data bits through memory block 10 is continuously monitored by a true address counter—see FIG. 2—that cycles through the number of data bits stored in memory block 10.

As an example, if, in the embodiment of FIG. 1, N = 32 and S = 63, the number of bits that are stored in memory block 10 is equal to $$32 \times (63 + 1) = 2048 \text{ bits}$$

Figure 2:
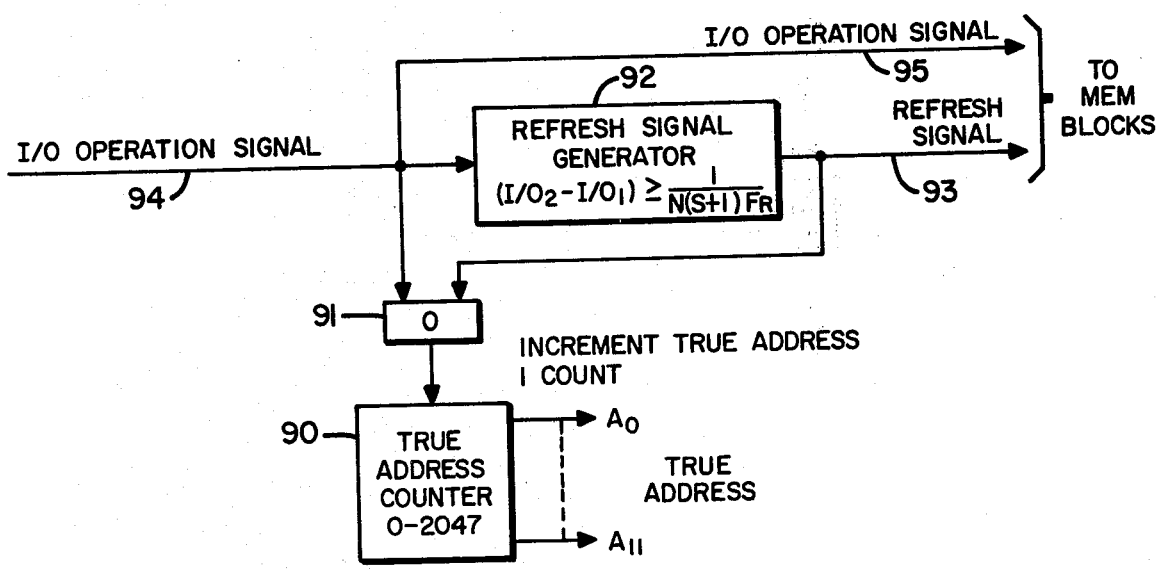
FIG. 2 is a block diagram of a prior art SPS CCD memory system true address counter.
Figure 4A:
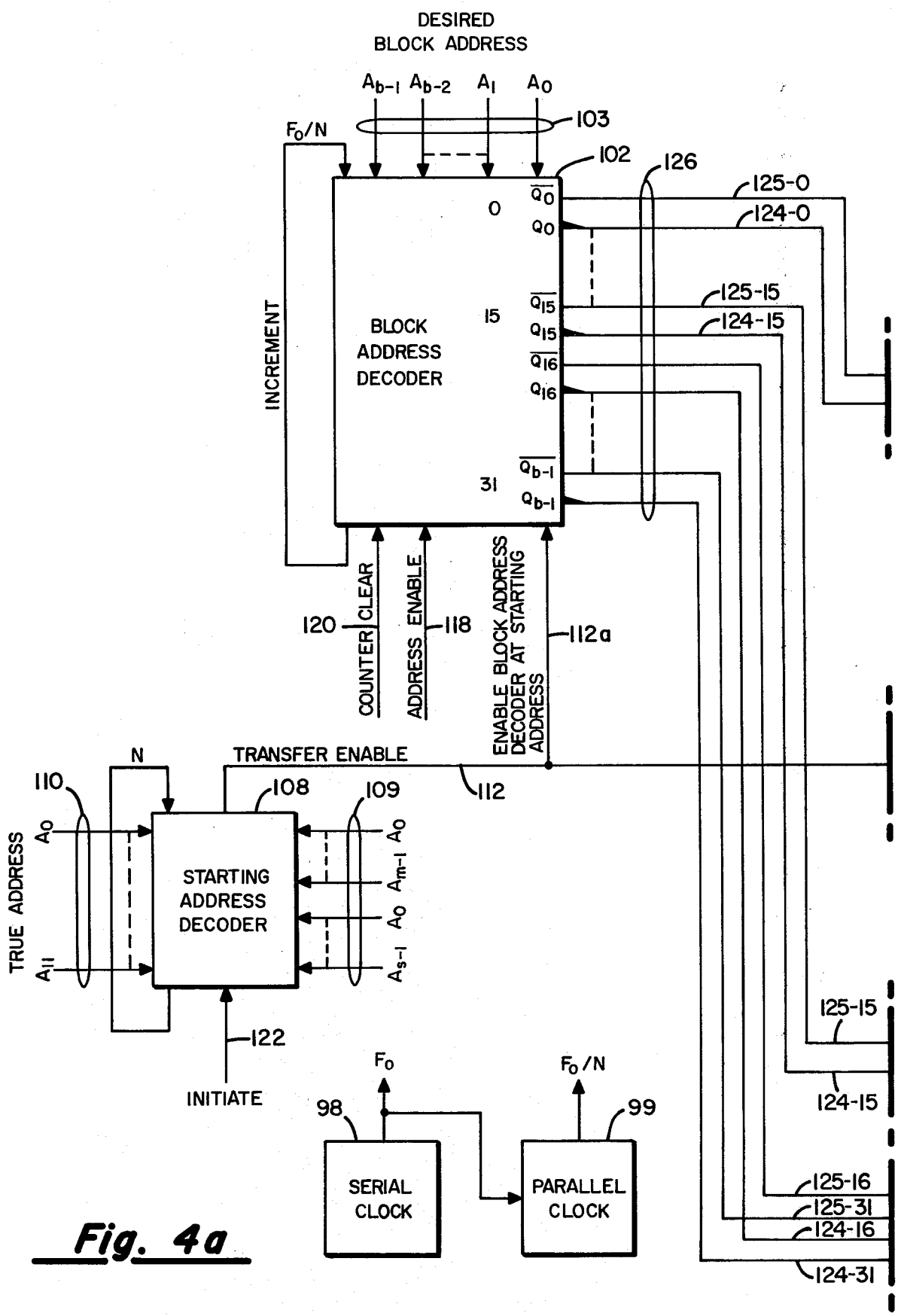
FIG. 4 showing the format of FIGS. 4a–4d which show a block diagram of the SPS CCD memory system of the present invention that is comprised of B memory blocks of FIG. 3.
Figure 4B:
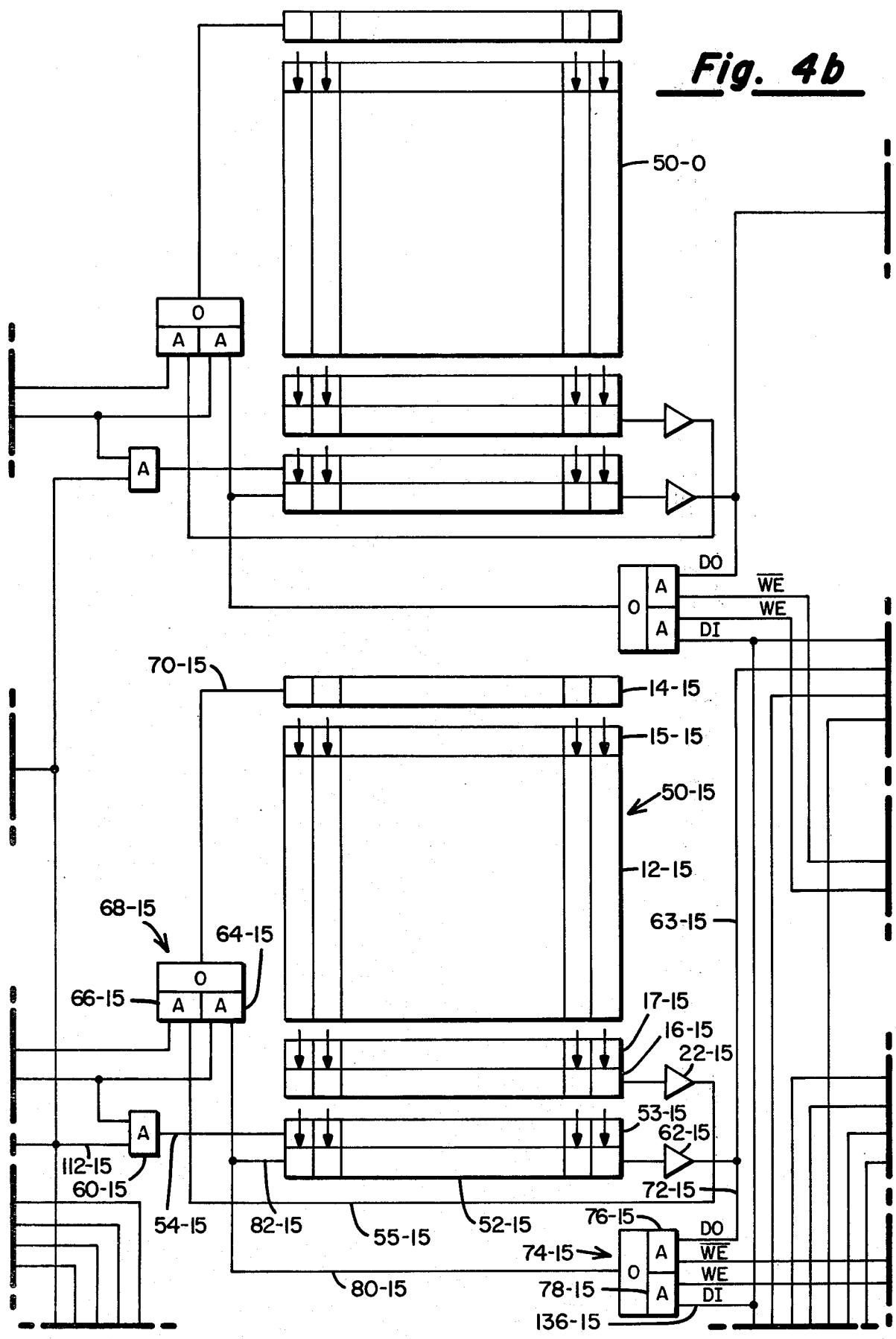
Figure 4C:
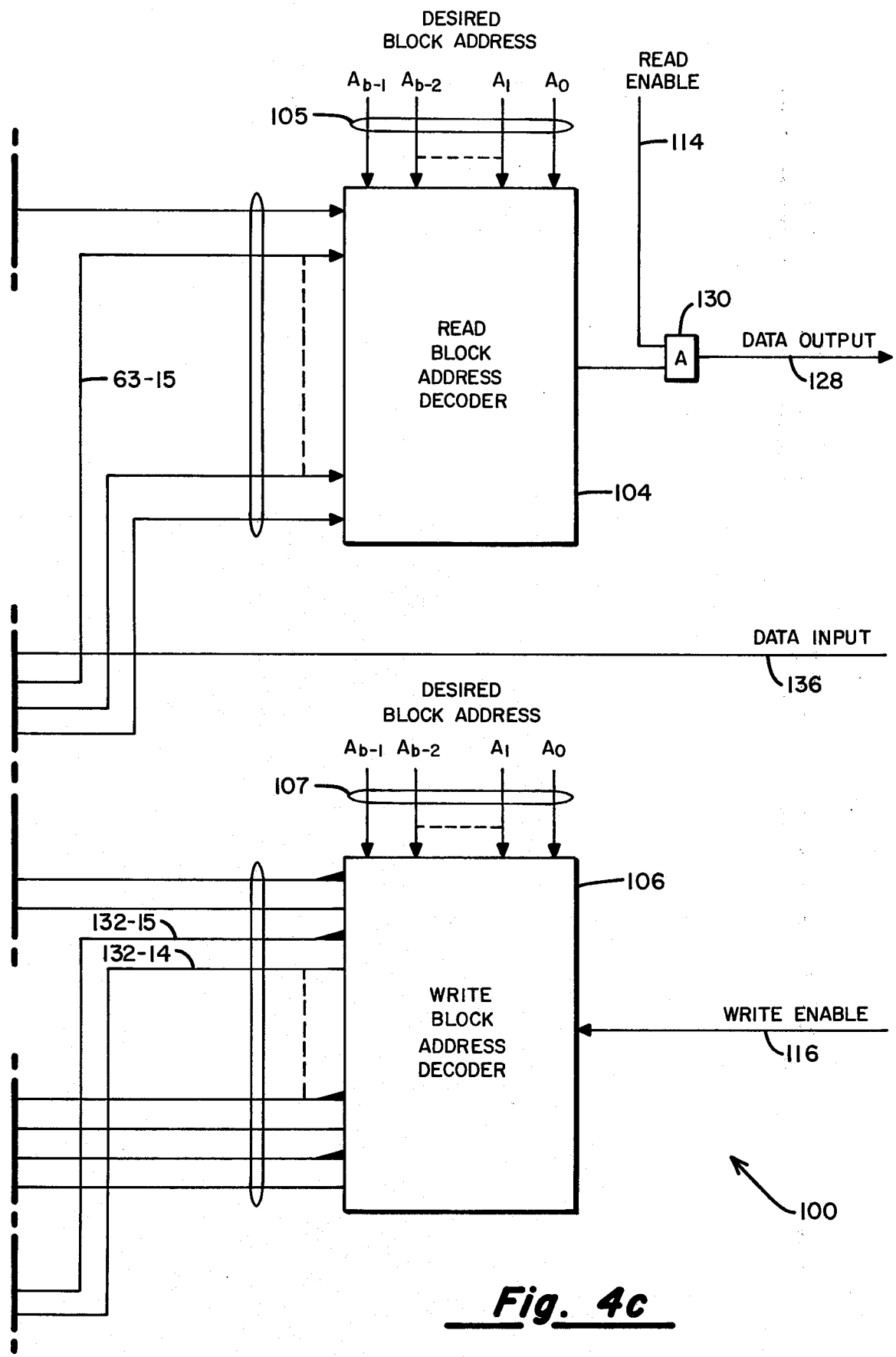
Figure 4D:
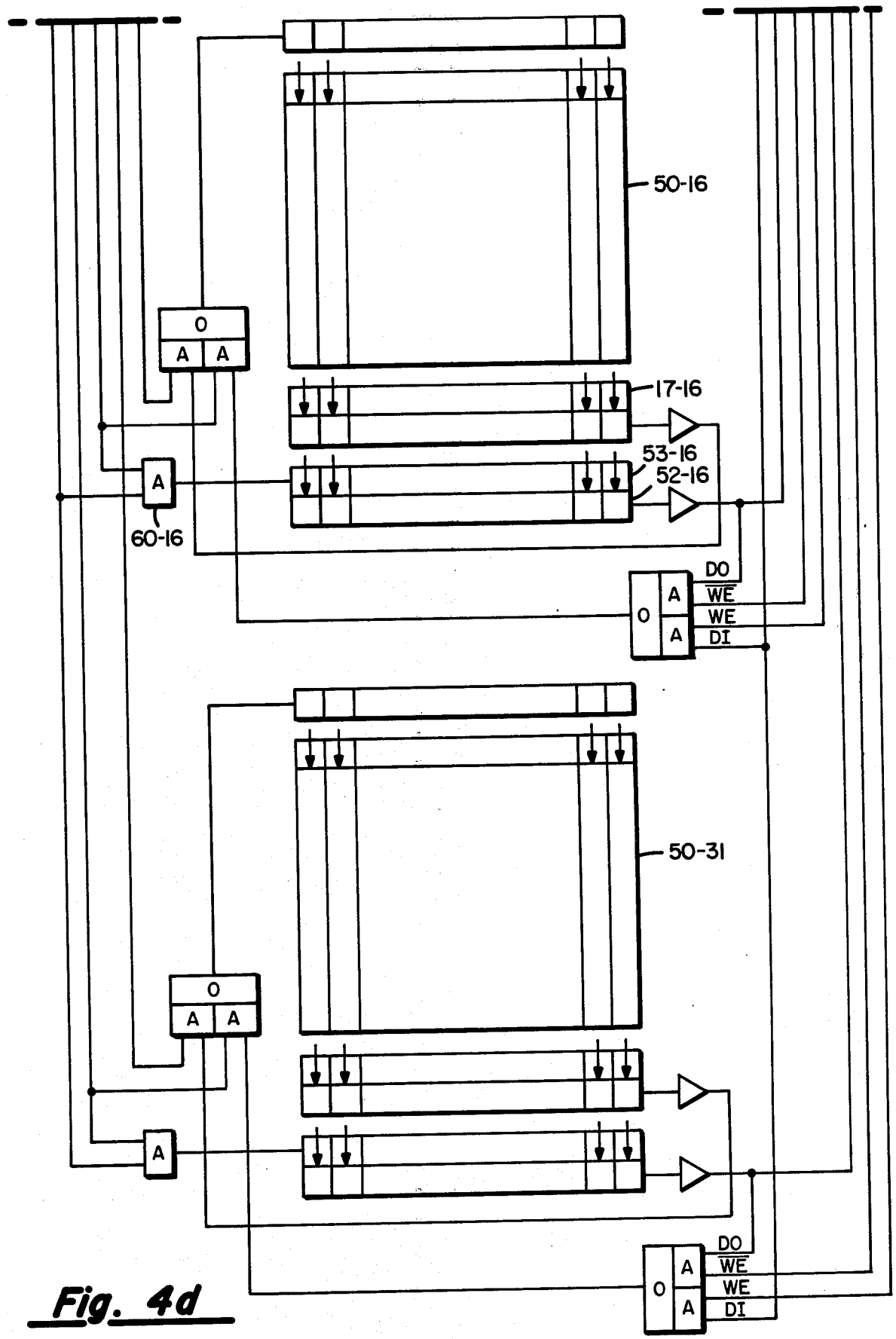

Accordingly, the true address counter for this embodiment would continuously and repetitively cycle through 0 through 2047 address counts, incrementing the count by 1 every time the data bits in memory block 10 are shifted 1 bit position, as by an I/O operation or by a Refresh signal—at a minimum frequency $N(S+1)F_R$—if the time separation between consecutive I/O cycles of operation is less than the refresh cycle of $1/N(S+1)F_R$—see FIG. 2.

However, if the memory system is in the, e.g., write mode, with the $\overline{\text{Write Enable}}$ signal on line 27 held Lo and the Write Enable signal on line 36 held Hi and if any two consecutive bits of the write data on line 37 are separated by a time duration equal to or greater than the refresh period $1/N(S+1)F_R$, a Refresh signal must be coupled to memory block 10. This Refresh signal cycles the data bits in input register 14 and output register 16 of memory block 10 1 bit to the right—while the data bits in parallel registers 12 are not effected unless the Refresh signal clock pulse occurs at the time the parallel registers 12 are to be shifted once every N shifts of the input register 14 and the output register 16.

However, this, and any consecutive Refresh signal clock pulse, causes the data bits in input register 14 and output register 16 to be shifted 1 stage to the right while generating an "empty" data bit in the first or left-most stage of input register 14. As the data bits are stored in memory block 10 in a compacted, consecutive or continuous bit stream, this "empty" data bit forces the memory system to halt the write operation and to cycle the, e.g., 2048 data bits that are stored in memory block 10 through memory block 10 until the address counter determines that the "empty" data bit is the data bit that is to be next written into the first stage of input register 14; when the address of the "empty" data bit or the "desired" address is equal to the "actual" address as determined by the address counter—see FIG. 2. This time that is required to again permit the writing of the next consecutive data bit into the "empty" data bit position in the first stage of input register 14 is called the maximum latency time for the memory system. After this maximum latency time, the true address counter enables the memory system to couple the next data bit, via Data In (DI) line 37, to line 34 and thence into the first stage of the input register 14 in a normal manner. It is a primary object of the present invention to reduce this maximum latency time to a minimum.

As a SPS CCD memory block is a serial device, for normal memory systems operation, as for a read, write or read, modify write operation, the memory block must be clocked to a rotational or starting address whereby the first data bit that is to be read out of the memory block must be located in the right-most stage of output register 16. The time to reach this starting address, i.e., when the addressed data bit is transferred into the last stage of output register 16, is the hereinabove discussed latency time. As an example, if the rotational or starting address is the data bit that is in the first bit position or left-most stage of input register 14, the latency time for that starting address to be shifted through memory block 10 and into the right-most stage of output register 16 would be the maximum latency time that is required to shift the 2048 data bits in a recirculation mode through the memory system.

This maximum latency time may be reduced by dividing a single large capacity memory block into a large number of smaller capacity memory blocks all on the same semiconductor chip while maintaining the same number of data bits or storage locations. As an example, the maximum latency time for a memory system comprised of a single memory block having 16,384 data bits capacity would be 8 times that of a memory system comprised of 8 memory blocks each of 2,048 data bits capacity. Thus, by means of a memory block decoder, each memory block would be individually addressed for I/O transfers while all of the memory blocks would be clocked in a simultaneous, parallel manner.

In transferring consecutive data bits out of a single memory block, or out of consecutive memory blocks, the maximum data bit transfer rate is determined by the clocking frequency F of the charged-coupled-device circuitry of the memory block; however, if the I/O transfer rate should drop below the slowest clock frequency allowable for refresh consideration, i.e., the hereinabove discussed Refresh signal frequency $N(S+1)F_R$, the so-effected memory block must be advanced by one or more Refresh signal pulses to keep the data bits stored in the affected memory block in a refreshed condition. As discussed hereinabove, this refresh mode rotates or advances the next consecutive data bit of the data bit stream past the I/O circuitry associated with the right-most stage of output register 16 such that for the next I/O transfer from this same memory block the memory block must be clocked one full revolution, e.g., 2048 clock pulses, less the number of Refresh signal pulses that were required for maintaining memory block 10 in a refresh condition. This condition may result in forced time delays in the I/O data bit transfer rate that may be equal to the maximum latency time of the memory block.

The object of the present invention is to improve the data bit transfer rate of a SPS CCD memory system for I/O transfer rates that drop below the slowest clock frequency allowable for refresh consideration without decreasing the maximum I/O transfer rates of a SPS CCD semiconductor chip structure or reducing the available data bit size of the sequential data block. An important advantage of the present invention is that it accomplishes this objective in a manner that does not adversely affect the reasons for choosing a SPS CCD semiconductor chip structure which reasons include preserving the highest bit density with adequate manufacturing yields of any known CCD memory system.

With particular reference to FIG. 3 there is presented a block diagram of the SPS CCD memory block 50 of the present invention; FIG. 4 presents a block diagram of the SPS CCD memory system of the present invention that is comprised of a plurality B of the memory blocks 50 of FIG. 3. Memory block 50 may be similar to memory block 10 of FIG. 1, and, accordingly, like items of FIGS. 1 and 2 are identified by like reference numerals. Memory block 50 may be considered to be similar to memory block 10 of FIG. 1 with the addition of the N-bit serial-shift I/O register 52, the associated transfer gates 53, AND 60, and AND/OR 63, all of which are formed on the same semiconductor chip as are the other elements of memory block 50.

Operation of memory block 50 of FIG. 3 is similar to that of memory block 10 of FIG. 1. Bits of N-bit slices are serially entered into the first or left-most stage of input register 14 at a first clock signal of frequency $F_0$. At a second clock signal of frequency $F_0/N$ the fully loaded input register 14, i.e., the N bits of the first slice, has its contents shifted bit-parallelly into the first stages of the N S-bit parallel registers 12—the N bits of the first and successive slices are shifted bit-parallelly through the S stages of the N S-bit parallel registers 12 after S cycles of the second clock signal. At the S+1 cycle of the second clock signal, the N bits of the first slice, which are now in the S'th stages of the N parallel registers 12, are transferred bit-parallelly into the like-ordered stages of the N-bit output register 16, via the associated transfer gates 17, and into the N-bit I/O register 52 via the associated transfer gates 53 if enabled by a Transfer Enable signal on line 54.

In memory block 10 of FIG. 1, transfer gates 15 and 17 unconditionally transfer the contents of the associated input register 14 and the last or Sth stages of the N parallel registers 12 into the associated first stages of the N parallel registers 12 and the associated stages of output register 16, respectively. However, with respect to transfer gates 53 there is utilized an associated enabling line 54 that, under control of a ring counter 56—see FIG. 5—and a Transfer Enable signal on line 112 and AND 60, selectively permits the bit-parallel transfer of the N bits in output register 16 into I/O register 52.

The configuration of memory block 50 of FIG. 3 is specifically implemented for and dictated by a SPS CCD memory system utilizing a plurality of memory blocks 50 for affecting a substantial reduction in maximum latency time as discussed hereinabove. FIG. 4 is a block diagram of the SPS CCD memory system of the present invention that is comprised of a plurality B memory blocks of FIG. 3. By means of this configuration of B memory blocks 50-0 through 50-(B-1) the data bits N(S+1), e.g., 2048, that are stored in each of the individual memory blocks 50 are independently, but synchronously, continuously recirculated in a closed loop operation utilizing independent recirculation lines for each memory block while, concurrently, one (and of course, all in synchronism) of the B memory blocks 50 is being clocked to the rotational or starting address or to the slice that contains the starting address.

Note, as discussed hereinabove, the starting address is defined as the one data bit out of the N(S+1) bits, e.g., 2048 data bits that are stored in the one of the B memory blocks 50 of the memory system of FIG. 4, which data bit is the first data bit of a serial string of data bits that comprise a data block. This first data bit may be positioned in any of the N bit positions or stages of a slice. I/O transfer, e.g., write or read operations, with respect to one of the B memory blocks 50 of the memory system of FIG. 4 is implemented by a ring counter 56 in block address decoder 102—see FIG. 5—Which selects the specific memory block 50 that contains the first data bit that is to be read from or written into the one selected memory block 50, which first data bit is defined as the starting address.

Ring counter 56 is automatically advanced from the starting address, provided by the block address bits
$A_{b-1}, \ldots A_1, A_0$ (where, e.g., b = 5)
one count for every parallel transfer of the slices through the S stages of the N-bit parallel registers 12. This parallel transfer of the slices through the parallel registers 12 of memory block 50 is, of course, accomplished at the low speed, parallel transfer, second clocking signal of frequency $F_0/N$. The purpose of the addition of the I/O register 52 to the memory block 10 of FIG. 1 is to provide a means for capturing and holding the bit-parallel output of the N parallel registers 12 for a read, write or read, modify write operation independently of the recirculation process of the individual B memory blocks via their output register 16.

As stated hereinabove, data blocks or blocks of data that are to be stored in the B memory blocks of memory system 100 of FIG. 4, are comprised of a plurality of data bits that are formed into a plurality of slices. The number of slices in any data block is limited to B. This limitation precludes overflow of excess data bits into the beginning of the data block while each consecutive slice of the data block is stored in consecutively numerically decreasing addresses in consecutively numerically increasing memory blocks.

When a data block is to be read out of or written into memory system 100: the block address bits
$A_{b-1}, \ldots A_1, A_0$
are coupled in parallel to a ring counter 56 in block address decoder 102; a read block address decoder 104; and a write block address decoder 106 for specifying the one of the B blocks in which the starting address lies;

the slice address bits
$A_{s-1}, \ldots A_1, A_0$
and the bit address bits
$A_{n-1}, \ldots A_1, A_0$
are coupled to a starting address decoder 108 for specifying the one of the 2048 data bits that are stored in the selected one of the B memory blocks from which or in which the first bit of the data block is to be read or written, i.e., the starting address for the read or write operation, respectively. Accordingly, the block address bits, the slice address bits and the bit address bits, respectively:

specify the one of the B memory blocks in which the first bit lies;

specify the one of the S+1 slices of the one of the B memory blocks in which the first bit lies;

specify the one of the N bit positions in the one of the S+1 slices of the one of the B memory blocks in which the first bit lies.

Figure 5:
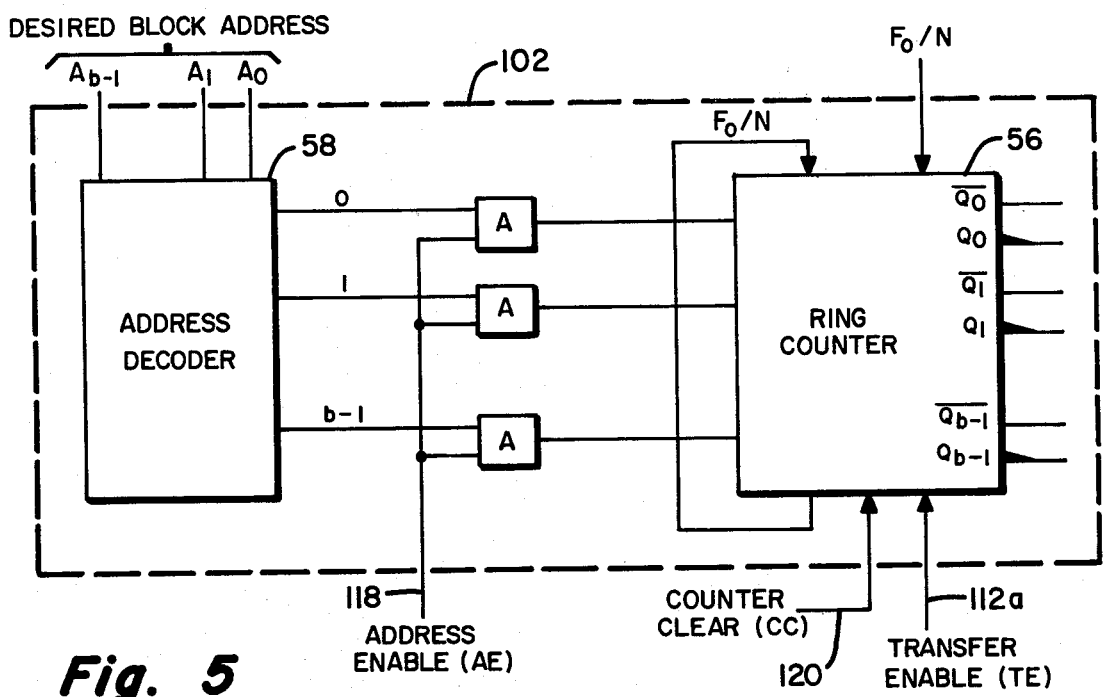
FIG. 5 is a detailed block diagram of an exemplary embodiment of the block address decoder of FIG. 4.

Block address decoder 102, via the desired block address bits being coupled to address decoder 58—see FIG. 5, is set to the address of the one of the B memory blocks in which the first bit lies. Starting address decoder 108, when the starting address on cable 109 is equal to the true address on cable 110, couples a Transfer Enable signal to line 112. This, via the enabled AND 60, transfers the slice in output register 16 into I/O register 52 from which the data may, e.g., be read out of the memory system 100 via line 63 and read block address decoder 104 at the first clock signal frequency $F_0$. If the data block is of a length that is greater than N, i.e., longer than a slice or an I/O register, the consecutive bits of the data block are bit-serially read out of the I/O registers of consecutively numerically increasing memory blocks at the first clock signal frequency $F_0$ until all the bits of the data block have been read out of the memory system.

Writing data into memory system 100 is accomplished in a similar addressing procedure. The first bit of the write data block is entered simultaneously into the first stages of the input register and the I/O register of the addressed one of the B memory blocks, with any overflow, i.e., any bits of the data block exceeding N, being entered in a similar fashion into the I/O register(s) of the consecutively numerically increasing memory block(s). The bits of the write data are then circulated through the I/O register until cleared at the end of the write cycle or when all I/O registers at the B memory blocks are filled.

As an example of the operation of memory system 100 of FIG. 4, consider memory system 100 as illustrating an SPS CCD memory system of B memory blocks (B = 32), each memory block storing S+1 slices (S = 63) and each slice being N bits in length (N = 32). Also assume that the starting address for an I/O operation is:

| | |
|---|---|
| block address | $A_{b-1}, \ldots A_1, A_0$ |
| $15_{10}$ | = 01111 |
| slice address | $= A_{s-1}, \ldots A_1, A_0$ |
| $12_{10}$ | = 001100 |
| bit address | $= A_{n-1}, \ldots A_1, A_0$ |
| $0_{10}$ | = 00000 |

It is to be remembered that all clocks of the B memory blocks 50-0 through 50-(b-1) are synchronized to the serial clock signal generator 98 first clock signal of frequency $F_0$, and that true address counter 90 of FIG. 2 continuously and repetitively counts through the number 0—2047 of the data bits stored in each of the memory blocks 50, it being incremented 1 count upon each I/O operation or each refresh operation (whenever the time duration between successive I/O operations is equal to or exceeds the refresh frequency $N(S+1)F_R$.

Initially,
the desired block address is coupled to:
block address decoder 102 via cable 103;
read block address decoder 104 via cable 105; and,
write block address decoder 106 via cable 107;
the starting address, as defined by the slice address and the bit address, is coupled to starting address decoder 108 via cable 109;
the WE signal on line 116 is Hi for a Write operation, Lo for a Read operation;
the RE signal on line 114 is Hi for a Read operation, Lo for a Write operation;
the true address, from true address counter 90, is coupled to starting address decoder 108 via cable 110.

Figure 6:
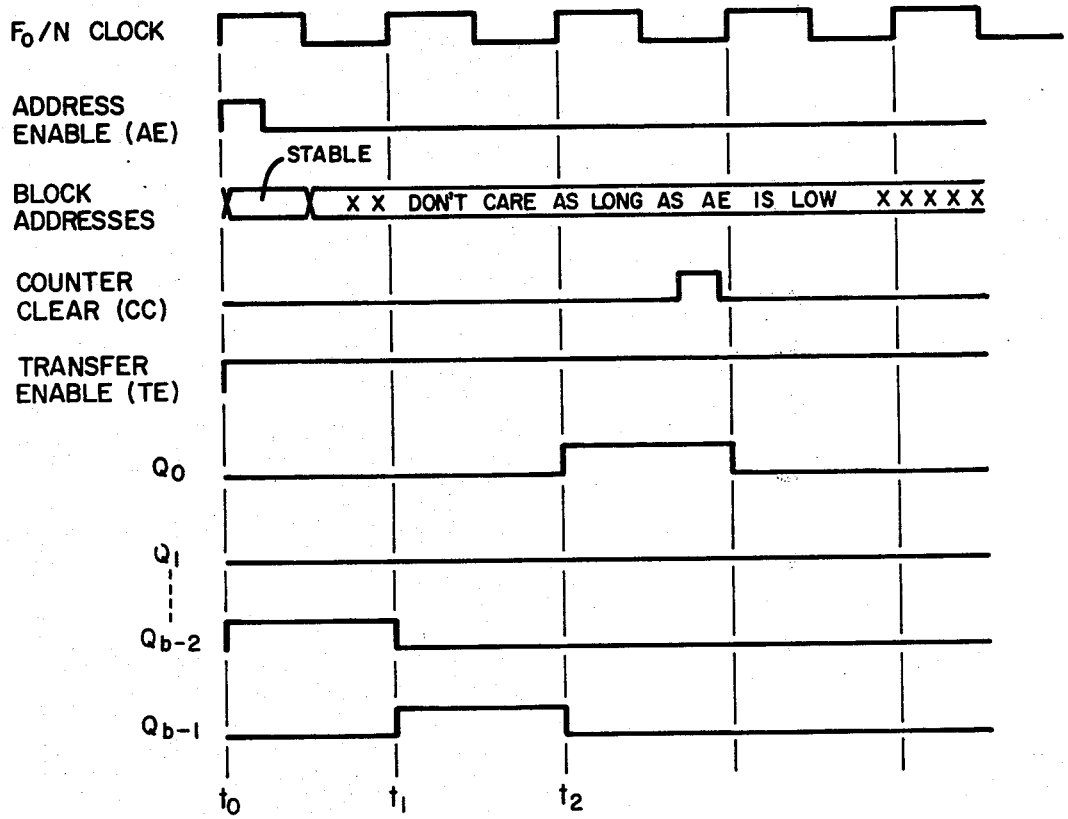
FIG. 6 is an exemplary timing diagram of the block address decoder of FIG. 5.

Next, a Hi signal on line 118 loads the desired block address on cable 103 into block address decoder 102; see FIGS. 5, 6 for an exemplary embodiment of block address decoder 102.

Next, the Hi Initiate Starting Address Decoder signal on line 122 initiates starting address decoder 108 to start comparing the true address on cable 110 to the starting address on cable 109.

Starting address decoder 108, at the first clock signal frequency F, compares the incrementing true address, from true address counter 90. At the time the starting address equals the true address, a Transfer Enable signal on line 112;

via line 112a enables ring counter 56 of block address decoder 102 to select the one addressed memory block 50-15 as determined by the desired block address on cable 103, switching or activating the two rail selection lines 124, 125 of cable 126. Activating lines 124, 125 switches the normal Lo, Hi signal levels to the selected complemented Hi, Lo signal levels. This enables AND 64-15 and disables AND 66-15 both of AND/OR 68-15; and, via line 112-15 enables AND 60-15 to, via line 54-15, enable transfer gates 53-15 transferring the slice in output register 16-15, in which the starting address lies, into I/O register 52-15.

At this time, when the true address equals the starting address or when the slice in which the starting address resides is fully loaded in the associated I/O register:
For a read operation:
the Read Data bits in I/O register 52-15, i.e., the Data Out (DO), are, via charge sensor 62-15, line 63-15, read block address decoder 104, and a Hi Read Enable signal on line 114, bit-serially, at the first clock signal frequency F, coupled to Data Out line 128 via the enabled AND 130;
the Read Data bits in I/O register 52-15, i.e., the Data Out (DO), are, via line 72-15, AND 76-15 of AND-/OR 74-15 and the enabling Hi $\overline{WE}$ signal and the disabling Lo WE signal from write block address decoder 106 via the two-rail selection lines 132-15, 134-15, respectively, line 80-15, AND 64-15 of AND/OR 68-15, and line 70-15, bit-serially, at the first clock signal frequency F, coupled to input register 14-15 for recirculation within memory block 50-15; and, the Read Data bits via line 80-15 and line 82-15, are bit-serially coupled to I/O register 52-15 at the first clock signal frequency $F_0$;
For a write operation:
the Read Data bits in I/O register 52-15, because of the disabling Lo Read Enable signal on line 114 and the disabling Lo $\overline{WE}$ signal on line 132 15, are bit-serially shifted out and ignored;
the Write Data bits, i.e., the Data In (DI), via Data In lines 136, 136-15, the enabling Hi WE signal on line 134-15, AND 78-15 of AND/OR 74-15, line 80-15 and line 82-15, are bit-serially coupled to I/O register 52-15 at the first clock signal frequency $F_0$;
the Write Data bits, via AND 64-15 of AND/OR 68-15 and line 70-15, are also bit-serially coupled to input register 14-15, at the first clock signal frequency $F_0$ for recirculation within memory block 50-15.

At the completion of the first parallel shift time of $N/F_0$ and the read, write, recirculation processing of the data bits in the output register 16-15 and the I/O register 52-15 of the one selected or addressed memory block 50-15;

block address decoder 102 is incremented one block count to address the next consecutively numerically increasing memory block, e.g., memory block 50-16, over the next parallel shift time of $N/F_0$;

Transfer Enable signal on line 112 enables the associated AND 60-16 and transfer gates 53-16 and the bit-parallel transfer of the second slice of the data block from output register 16-16 to I/O register 52-16;

operation of the consecutively numerically increasing memory blocks continues as discussed above with respect to memory block 50-15 until the last slice of the data block has been processed at which time the Counter Clear signal on line 120 is pulsed to clear ring counter 56.

Note that this operation, once the true address of the slice in which the starting address lies is positoned in the N stages of the output register of the one selected memory block in which the starting address lies, selects the true addresses of consecutively numerically increasing memory blocks, e.g., memory blocks 50-15, 50-16, etc., at successive second clock signal frequencies $F_0/N$—if I/O operation is at the first clock signal frequency $F_0$ (or at least faster than the refresh frequency $N(S+1)F_R$)—such that the consecutive slices of the data block are, e.g., read out of consecutive memory blocks at consecutive second clock signal cycles or parallel shifts at the frequency $F_0/N$. This then requires that the consecutive slices of the data block be positioned, at any given instant in time, in consecutively numerically decreasing stages of the parallel registers 12 of the consecutively numerically increasing memory blocks 50 of memory system 100.

This above discussion assumes that that consecutive I/O operations—one data bit read out of or written into the one addressed memory block 50 constitutes an I/O operation—occur within the hereinabove discussed refresh period $1/N(S+1)F_R$—block such that no refresh operation is required to maintain the data that are stored in memory block 50 in the refreshed condition. Under this assumed condition—that the I/O transfer rates are faster than the demand refresh rate of $N(S+1)F_R$—block address decoder 102, read address decoder 104 and write block address decoder 106 have the same block address coupled therein. Also, the one addressed, e.g., memory block 50-15 utilizes the data bits that are stored in its, e.g., I/O register 52-15 in the recirculation loop of, e.g., line 80-15 while the other non-addressed, e.g., memory blocks 50-0 through 50-14 and 50-16 through 50-31 utilize the data bits that are stored in their, e.g., output register 16-0 through 16-14 and 16-16 through 16-31 in the recirculation loop of, e.g., line 55-0 through 55-14 and 55-16 through 55-31. Further, after the consecutively numerically increasing I/O registers have performed their read/write function—with the data bits stored therein being recirculated in a continuous end-around shift via, e.g., lines 72-15, 80-15 and 70-15—the data in the I/O registers are cleared for reception of new data bits from the associated output register.

For I/O transfer rates that are slower than the allowable refresh rate of $N(S+1)F_R$, read block address decoder 104 and write address block decoder 106 may not have the same block address coupled therein as the block address decoder 102. If one or more write/read I/O operations fall below the minimum refresh frequency $N(S+1)F_R$, block address decoder 102 will advance ahead of the read block address decoder 104 and the write block address decoder 106 to continue loading the I/O registers of the consecutively addressed memory blocks 50. The data bits that are transferred into the I/O registers will be recirculated therein in a continuous end-around shift until the data bits are cleared for reception of new data bits from the associated output register or until a Write Enable signal via line 116 is coupled into that particular memory block by Lo $\overline{WE}$, Hi WE signals on, e.g., lines 132, 134, respectively. I/O transfers within each memory block occur directly from and into the I/O registers, which I/O registers are randomly accessed by the block address decoder 102. For each I/O transfer that falls below the minimum refresh period of $N(S+1)F_R$, the slippage in the I/O transfer rate will be one revolution of the I/O register, i.e., N recirculation cycles of a frequency $F_0$ less the number of refresh operations. For a write operation, the data bits are held in the I/O registers and must be then subsequently written into the associated memory block at the appropriate addresses.

A brief summary of the modes of operation of memory system 100 of FIG. 4 is as follows:

1. I/O operation rate faster than refresh rate of $N(S+1)F_R$ a. Read

Block address decoder 102 selects, via AND/OR 68, the memory block from which the first slice of the read data block is to be read.

Starting address decoder 108 at the selected memory block bit-parallelly gates, via AND 60, the read data bit of the first slice of the read data block into the associated I/O register from the output register.

Read block address decoder 104 at the selected memory block bit-serially gates, via line 63, the read data bits of the first slice of the read data block from the right-most bit position of the I/O register of the selected memory block onto DO line 128.

Write block address decoder 106 bit-serially gates, via Hi $\overline{WE}$, Lo WE signals at AND/OR 74 of the selected memory block, the read data bits of the first slice of the read data block from the I/O register of the selected memory block into the first, left-most, bit position of both the I/O register and the input register.

Block address decoder 102, via AND/OR 68 of the unselected memory blocks, bit-serially gates the read data bits of the read data slices from the right-most bit positions of the output registers of the unselected memory blocks into the first, left-most, bit positions of the associated input registers.

Block address decoder 102 selects, via AND/OR 68, the next consecutive memory block from which the second slice of the read data block is to be read.

Starting address decoder 108 at the selected memory block bit-parallelly gates, via AND 60, the read data bits of the second slice of the read data block into the associated I/O register from the output register.

Read block address decoder 104 at the selected memory block bit-serially gates, via line 63, the read data bits of the second slice of the read data block from the right-most bit position of the I/O register of the selected memory block onto DO line 128.

Write block address decoder 106 bit-serially gates via Hi $\overline{WE}$, Lo WE signals at AND/OR 74 of the selected memory block, the read data bits of the second slice of the read data block from the right-most bit position of the I/O register of the selected memory block into the first, left-most, bit position of both the I/O register and the input register.

Block address decoder 102, via AND/OR 68 of the unselected memory blocks, bit-serially gates the read data bits of the read data slices from the right-most bit positions of the output registers of the unselected memory blocks into the first, left-most, bit positions of the associated input registers.

The processes above repeat until the read data bits of the last slice of the read data block have been gated out onto DO line 128, after which the contents of the I/O registers may be cleared by line 138.

b. Write

Block address decoder 102 selects, via AND/OR 68, the memory block into which the first slice of the write data block is to be written.

Starting address decoder 108 at the selected memory block bit-parallelly gates, via AND 60, the read data bits that will be modified to form the first slice of the write data block into the associated I/O register from the output register.

Write block address decoder 106 bit-serially gates, via Lo $\overline{WE}$, Hi WE signals at AND/OR 74 of the selected memory block, the write data bits of the first slice of the write data block from DI line 136 into the left-most bit position of both the I/O register and the input register of the selected memory block.

Block address decoder 102, via AND/OR 68 of the unselected memory blocks, bit-serially gates the read data bits of the read data slices from the right-most bit positions of the output registers of the unselected memory blocks into the first, left-most, bit positions of the associated input registers.

Block address decoder 102 selects, via AND/OR 68, the next consecutive memory block into which the second slice of the write data block is to be written.

Starting address decoder 108 at the selected memory block bit-parallelly gates, via AND 60, the read data bits that will be modified to form the second slice of the write data block into the associated I/O register from the output register.

Write block address decoder 106 bit-serially gates, via Lo $\overline{WE}$, Hi WE signals at AND/OR 74 of the selected memory block, the write data bits of the second slice of the write data block from DI line 136 into the left-most bit position of both the I/O register and the input register of the selected memory block.

Block address decoder 102, via AND/OR 68 of the unselected memory blocks, bit-serially gates the read data bits of the read data slices from the right-most bit positions of the output registers of the unselected memory blocks into the first, left-most, bit positions of the associated input registers.

The process above repeats until the write data bits of the last slice of the write data block have been written into the associated memory block, after which the contents of the I/O register may be cleared by line 138.

2. I/O operation rate slower than refresh rate of $N(S+1)F_R$ a. Read

Block address decoder 102 selects via AND/OR 68, the memory block from which the first slice of the read data block is to be read.

Starting address decoder 108 at the selected memory block bit-parallelly gates, via AND 60, the read data bits of the first slice of the read data block into the associated I/O register from the output register.

Read block address decoder at the selected memory block for, e.g., d consecutive read I/O operations (assuming such read I/O operations to be at a rate that is faster than the refresh rate $N(S+1)F_R$, where $1 \leq d < N$, i.e., d is equal to one or more but less than all of the N read data bits of the first slice of the read data block that are resident in the I/O register) bit-serially gates, via line 63, the first d read data bits of the first slice of the read data block from the right-most bit position of the I/O register of the selected memory block onto DO line 128.

Write block address decoder 106 bit-serially gates, via Hi $\overline{WE}$, Lo WE signals at AND/OR 74 of the selected memory block, the d read data bits of the first slice of the data block from the right-most bit position of the I/O register of the selected memory block into the left-most bit position of both the I/O register and the input register.

Block address decoder 102, via AND/OR 68 of the unselected memory blocks, bit-serially gates the d read data bits of each of the read data slices from the right-most bit position of each of the output registers of the unselected memory blocks into the first, left-most, bit position of each of the associated input registers.

Assuming a delay after the d'th read I/O operation that is greater than the refresh rate of $N(S+1)F_R$, refresh signal generator 92, via line 93, couples a Refresh signal to the Refresh signal inputs of all of the memory blocks. This, in each of the unselected memory blocks, gates the (d+1)'th bit of the read data slice from the output register into the first, left-most, bit position of the associated input register. This, in the selected memory block, gates the (d+1)'th bit of the first slice of the read data block from the right-most bit position of the I/O register into the left-most bit position of both the I/O register and the input register.

After completion of the single refresh cycle upon both the selected and unselected memory blocks at the first clock signal frequency F, both the selected and unselected memory blocks are subjected to N-1 repositioning cycles at the first clock signal frequency F. This, in the unselected memory blocks, bit-serially gates the N-1 read data bits out of each of the output registers into the associated input register via the circulation line 55, AND/OR 68 and line 70. In the selected memory block, this repositions the (d+1)'th bit in the right-most bit position of I/O register 52 in readiness for the next read I/O operation. Note that after the N'th read data bit of the read data slice has been shifted out of the right-most bit position of I/O register 52 of the currently selected memory block, block address decoder 102 unselects the currently-selected memory block and selects the next numerically higher memory block while the read address decoder 104 and the write address decoder 106 retain the currently-selected memory block address, i.e., the desired block address, or inputs on their cables 105 and 107, respectively. Thus, block address decoder 102 has advanced to select the next memory block as determined by starting address decoder 108 while read block address decoder 104 and write block address decoder 106 retain the address of the desired memory block until the read operation has been completed by the gating of the N read data bits of the read data slice from I/O register 52 of the memory block that was being read out of at the time the refresh cycle was initiated. This is so as block address decoder 102 responds to true address counter 90 via starting address decoder 108, which is incremented one count for every I/O operation of read, write, read modify write and including every positioning, repositioning and refresh cycle. Thus, although block address decoder 102 is responsive to the changing count of the true address, read address decoder 104 and write address decoder 106 are responsive to the changing count of the address of only those data bits that are to be read out of or written into the memory block(s).

Read block address decoder 104 at the selected memory block, for N-d consecutive I/O operations, now assuming such I/O operations to be at a rate that is faster than the refresh rate of $N(S+1)F_R$, bit-serially gates the remaining N-d read data bits of the first slice of the read data block from the right-most bit position of the associated I/O register onto DO line 128.

Write block address decoder 106 bit-serially gates, via Hi $\overline{WE}$, Lo WE signals at AND/OR 74 of the selected memory block, the N-d read data bits of the first slice of the read data block into the left-most bit position of both the I/O register and the input register.

Block address decoder 102, via AND/OR 68 of the unselected memory blocks, bit-serially gates the N-d read data bits of the first slice of the read data block from the right-most bit position of each of the output registers into the first, left-most, bit position of each of the associated input registers.

Block address decoder 102 selects the next consecutive memory block from which the second slice of the read data block is to be read.

Starting address decoder 108 at the selected memory block bit-parallelly gates the read data bits of the second slice of the read data block into the associated I/O register from the output register.

Read block address decoder 104 at the selected memory block bit-serially gates the read data bits of the second slice of the read data block from the right-most bit position of the I/O register of the selected memory block onto DO line 128.

Write block address decoder 106 bit-serially gates, via Hi $\overline{WE}$, Lo WE signals at AND/OR 74 of the selected memory block, the read data bits of the second slice of the read data block from the right-most bit position of the I/O register of the selected memory block into the left-most bit positions of both the I/O register and the input register.

Block address decoder 102, via AND/OR 68 of the unselected memory blocks, bit-serially gates the read data bits of the read data slices from the right-most bit positions of each of the output registers of the unselected memory blocks into the first, left-most bit positions of the associated input registers.

The process above repeats until the read data bits of the last slice of the read data block have been gated out onto DO line 128, all assuming no further delays between read I/O operations that are greater than the refresh rate of $N(S+1)F_R$.

b. Write

Block address decoder 102 selects the memory block into which the first slice of the write data block is to be written.

Starting address decoder 108 at the selected memory block bit-parallelly gates the read data bits that will be modified to form the first slice of the write data block into the associated I/O register from the output register.

Write block address decoder 106 at the selected memory block for d consecutive write I/O operations (assuming such write I/O operations to be at a rate that is faster than the refresh rate of $N(S+1)F_R$ where $1 \leq d < N$, i.e., d is equal to one or more but less than all of the N write data bits of the first slice of the write data block) bit-serially gates, via Lo $\overline{WE}$, Hi WE signals at AND/OR 74 of the selected memory block, the first d write data bits of the first slice of the write data block from DI line 136 into the left-most, d bit positions of both the I/O register and the input register of the selected memory block.

Block address decoder 102, via AND/OR 68 of the unselected memory blocks, bit-serially gates the first d read data bits of the read data slices from the right-most bit positions of each of the output registers of the unselected memory blocks into the first d, left-most, bit position of the associated input registers.

Assuming a delay after the d'th write I/O operation that is greater than the refresh rate of $N(S+1)F_R$, refresh signal generator 92, via line 93, couples a Refresh signal to the Refresh signal inputs of all of the memory blocks. This, in the unselected memory blocks, gates the (d+1)'th bits of the read data slices from the right-most bit positions of each of the output registers into the first, left-most, bit position of each of the associated input registers. This, in the selected memory block, gates an "empty" bit (because no write data is available during the refresh operation) into the first, left-most bit position of both the I/O register and the input register. This "empty" bit, as it is the (d+1)'th bit that was in the last, right-most bit position of the I/O register prior to the refresh operation, is actually the (d+1)'th bit of the read data slice that had been bit-parallelly transferred from the output register into the I/O register by starting address decoder 108. This "empty" bit, which has been transferred into the input register and that subsequently will be cycled through the associated S-bit parallel register, will, after completion of the transfer of the write data block, be replaced by the corresponding bit of the write data slice that has been stored in, during the next subsequent write I/O operation, and then cycled in an endless end-around shift of the I/O register of the associated memory block.

Because the (d+1)'th bit of the first slice of the write data block that is now in the left-most bit position of the I/O register of the selected memory block is an "empty" bit, the I/O register of the selected memory block must now be affected by N-1 consecutive pulses of the first clock signal of frequency $F_0$. This end-around shift of the data bits in the I/O register positions the (d+1)'th bit of the first slice of the write data block in the right-most bit position of the I/O register in preparation for the next write I/O operation. At that time the (d+1)'th bit of the first slice of the write data block will be coupled to and gated by write block address decoder 106, via DI line 136 and AND/OR 74, into the left-most bit position of the I/O register and into the left most bit position of the input register of the selected memory block into which the "empty" bit was written after the empty bit is cycled through the associate S-bit parallel register.

Write block address decoder 106, at the selected memory block, for N-d consecutive write I/O operations, now assuming such I/O operations to be at a rate that is greater than the refresh rate of $N(S+1)F_R$, bit-serially gates, via Lo $\overline{WE}$, Hi WE signals at AND/OR 74 of the selected memory block, the remaining N-d write data bits of the first slice of the write data block from DI line 136 into the left-most position of the I/O register and after the empty bit has been cycled through the associated S-bit parallel register into the left-most position of the input register of the selected memory block.

Block address decoder 102 at the unselected memory block, for the N-d consecutive refresh cycle and positioning cycles that are of a rate faster than the refresh rate of $N(S+1)F_R$, bit-serially gates, via AND/OR 68, the read data bits of the read data slices from the right-most bit position of each of the output registers of the unselected memory blocks into the first, left-most, bit positions of the associated input registers.

For the remaining d positioning cycles, Block address decoder 102 advances to the next memory block and loads its I/O register with the next expected read data slice and unselects the memory block that is currently being written into by write block address decoder 106. Therefore, this current memory block, for following data slices, appears unselected by Block address decoder 102.

At the start of the dth positioning cycle, block address decoder 102 selects the next consecutive memory block into which the second slice of the write data block is to be written.

Starting address decoder 108, at the selected memory block, bit-parallelly gates, via AND 60, the read data bits that will be modified to form the second slice of the write data block into the associated I/O register from the output register.

Write block address decoder 106 at the selected memory block bit-serially gates, via Lo $\overline{WE}$, Hi $\overline{WE}$ signals at AND/OR 74 of the selected memory block, the write data bits of the second slice of the write data block from DI line 136 into the left-most bit position of both the I/O register and the input register.

The process above repeats until the write data bits of the last slice of the write data block have been gated from DI line 136 into the I/O register and the input register that are associated with the memory block into which the last slice of the write data block is to be written.

After completion of the transfer of the write data block any "empty" bits that have been written into the memory blocks are "filled" by the writing therein of the corresponding write data bit that has been circulating in an end-around fashion through the associated I/O register. After all "empty" bits have been "filled" by the write data bits saved in the corresponding I/O register, the I/O registers may be cleared via line 138.

Figure 7:
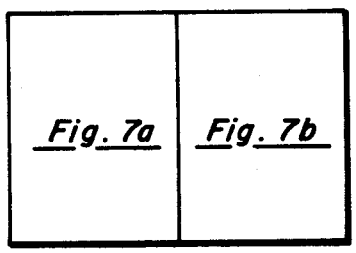
FIGS. 7 through 11B are exemplary timing diagrams of the operation of an SPS CCD memory system incorporating the present invention.
Figure 8:
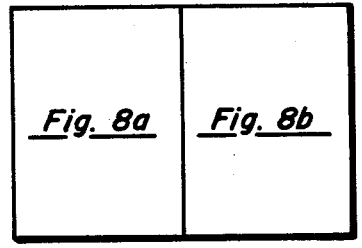
Figure 9:
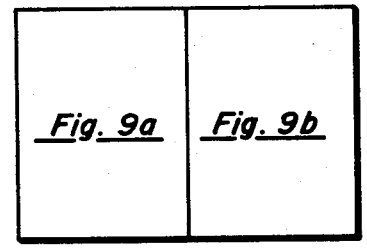
Figure 10:
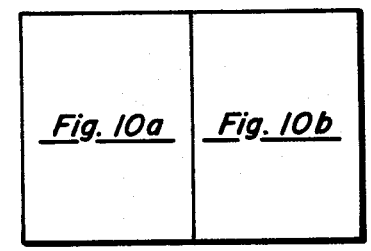
Figure 11:
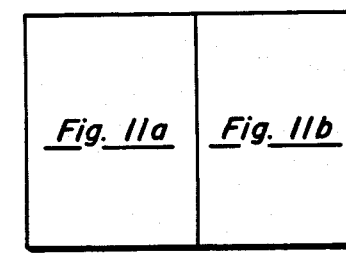
Figure 7A:
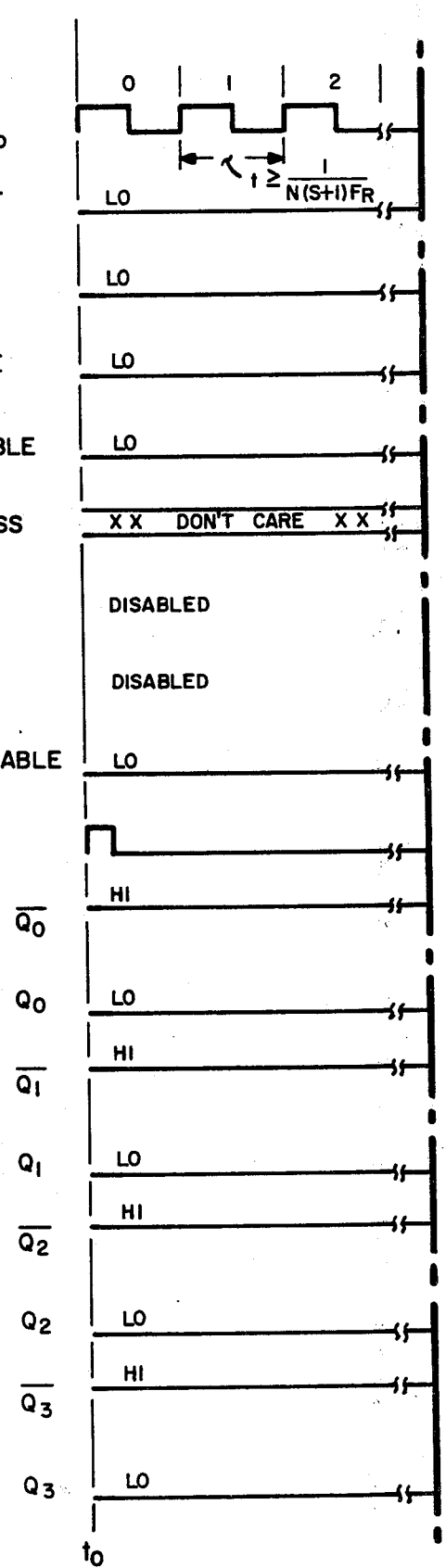
Figure 7B:
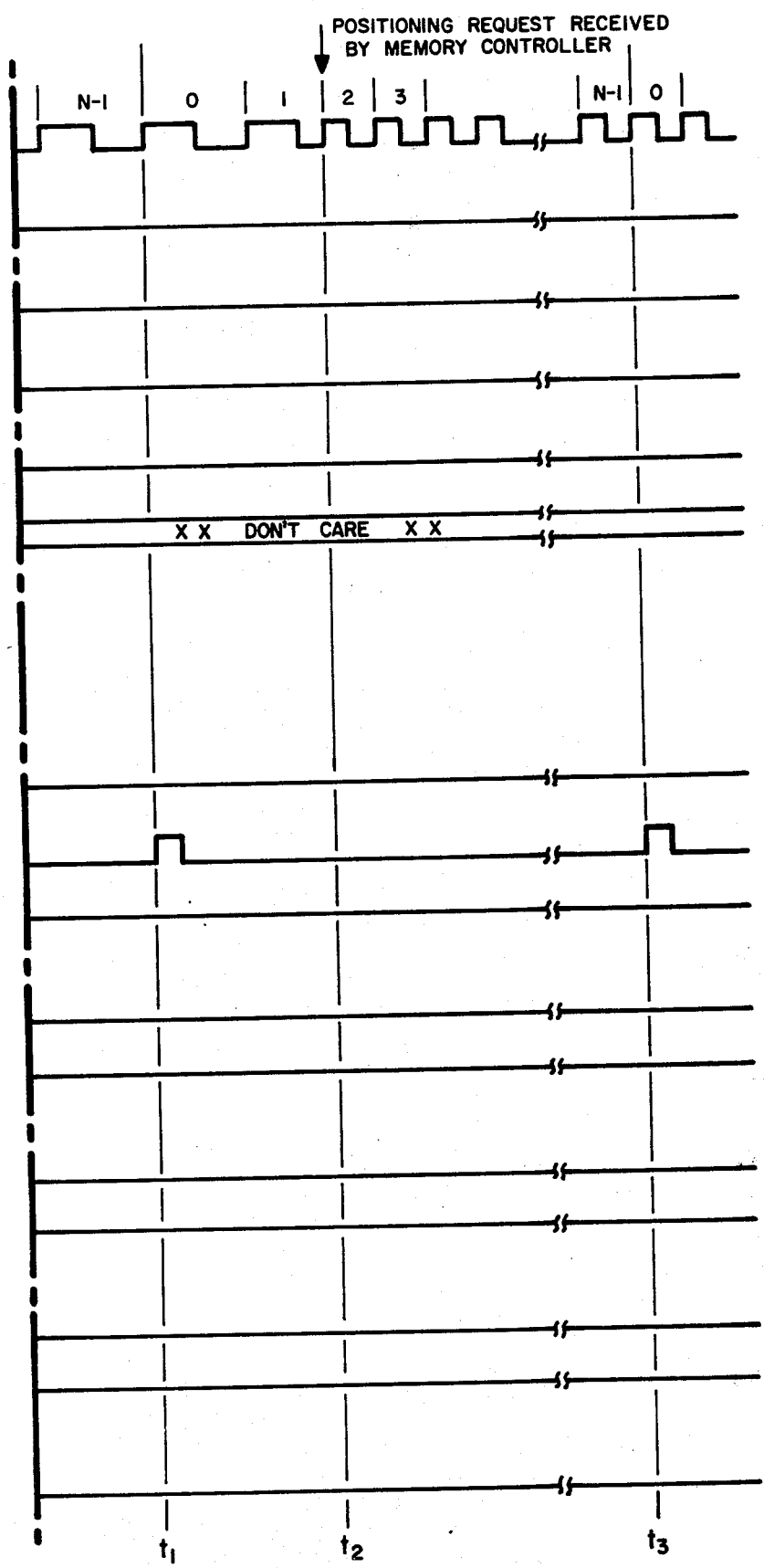
Figure 8A:
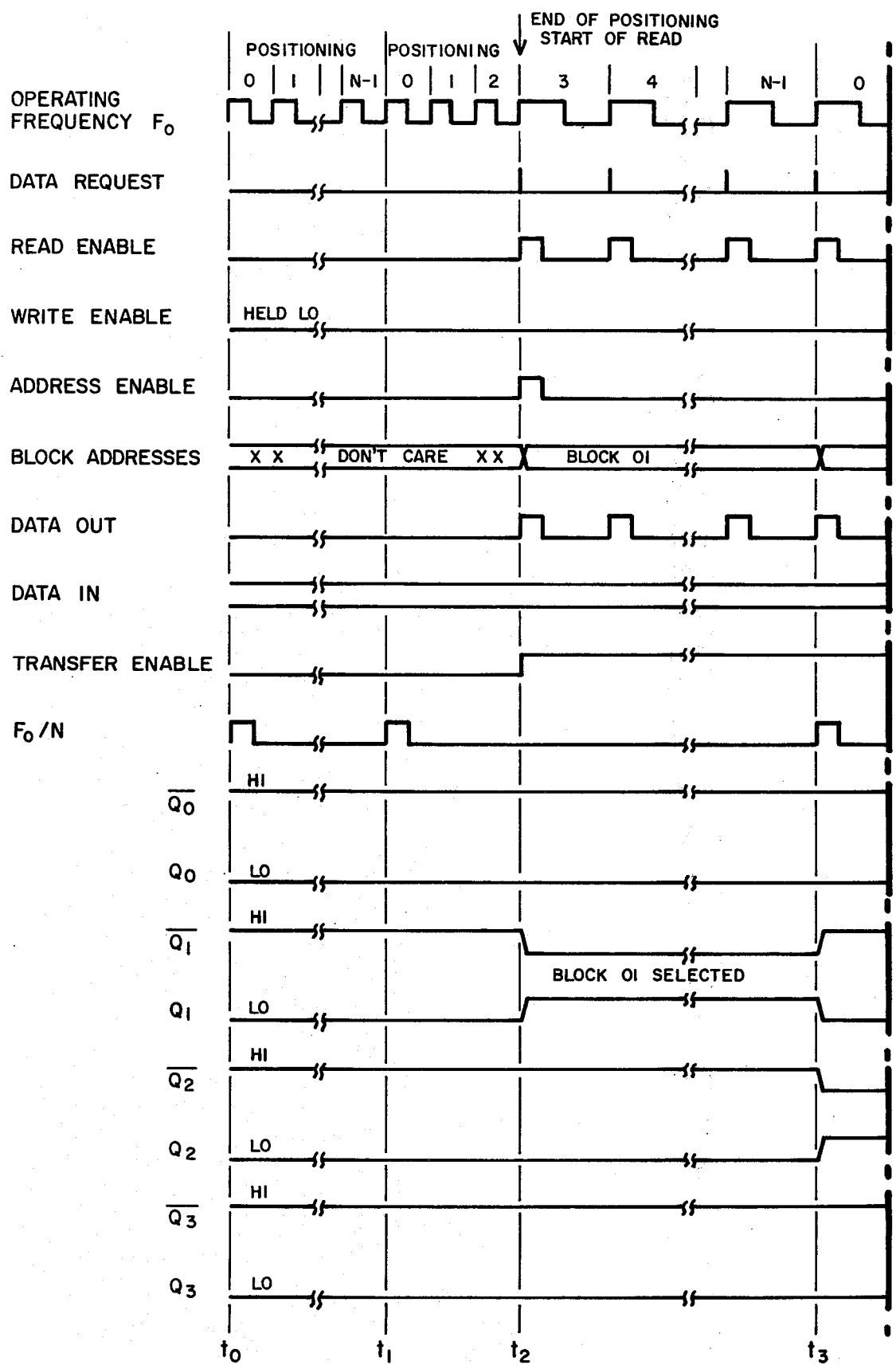
Figure 8B:
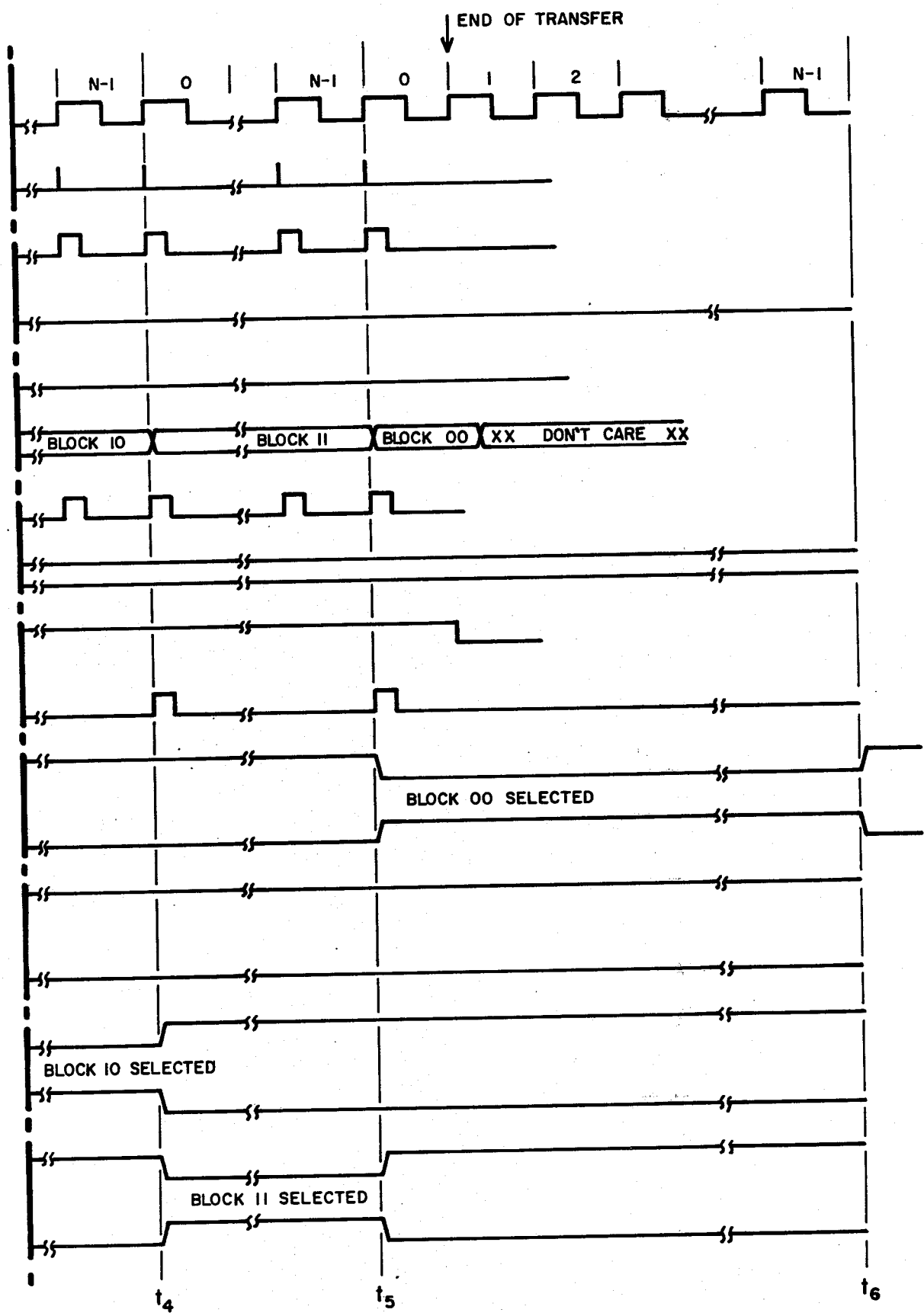
Figure 9A:
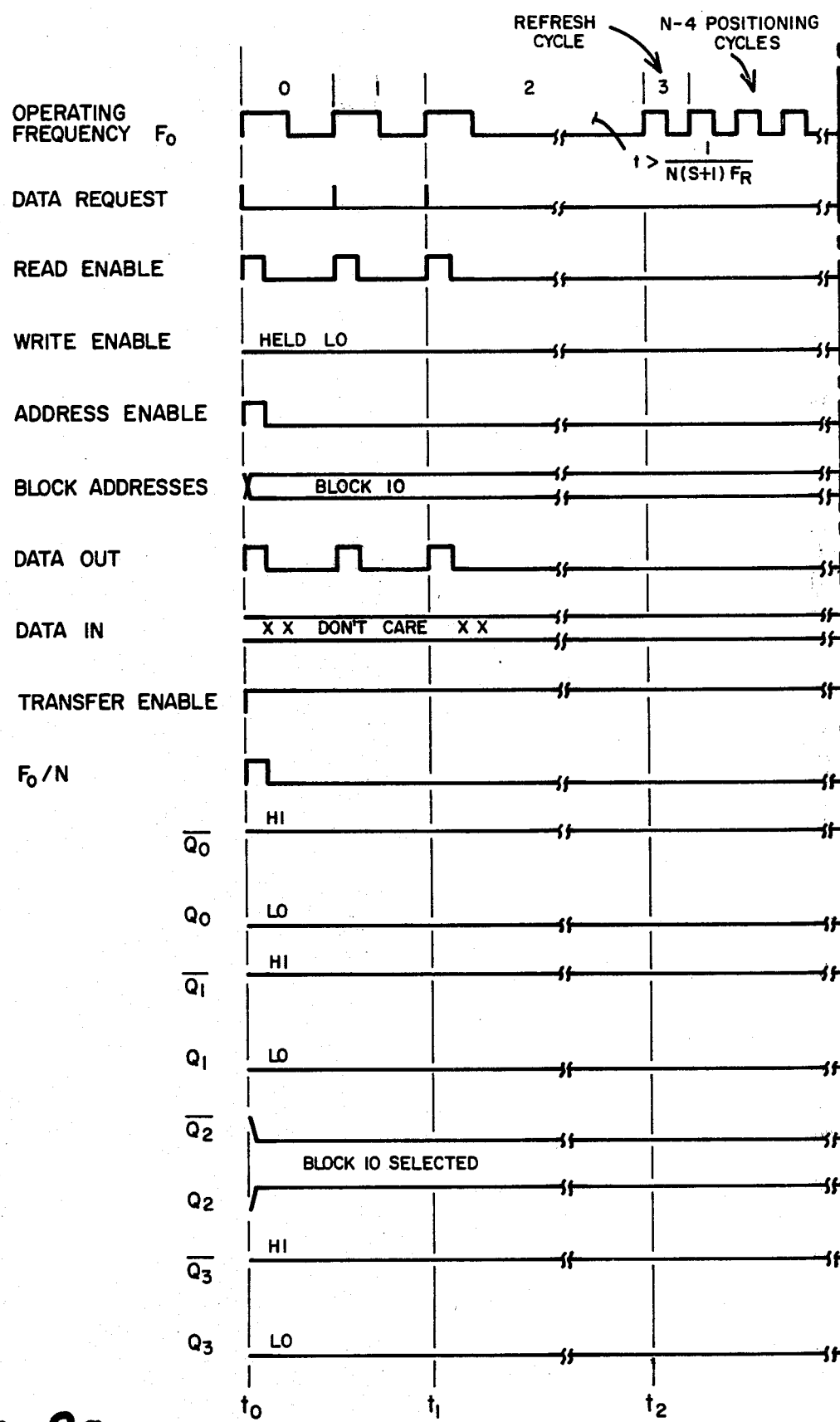
Figure 9B:
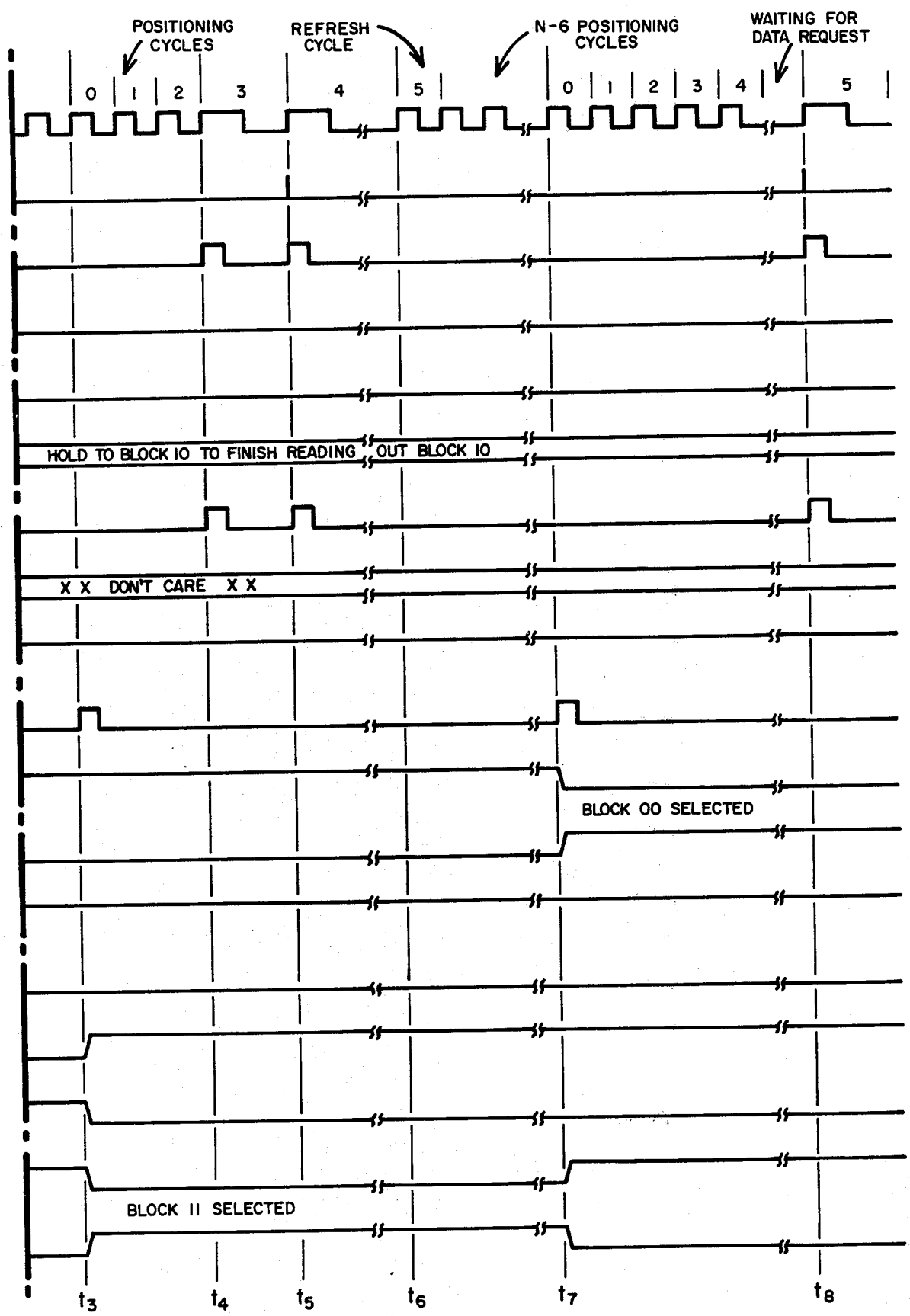
Figure 10A:
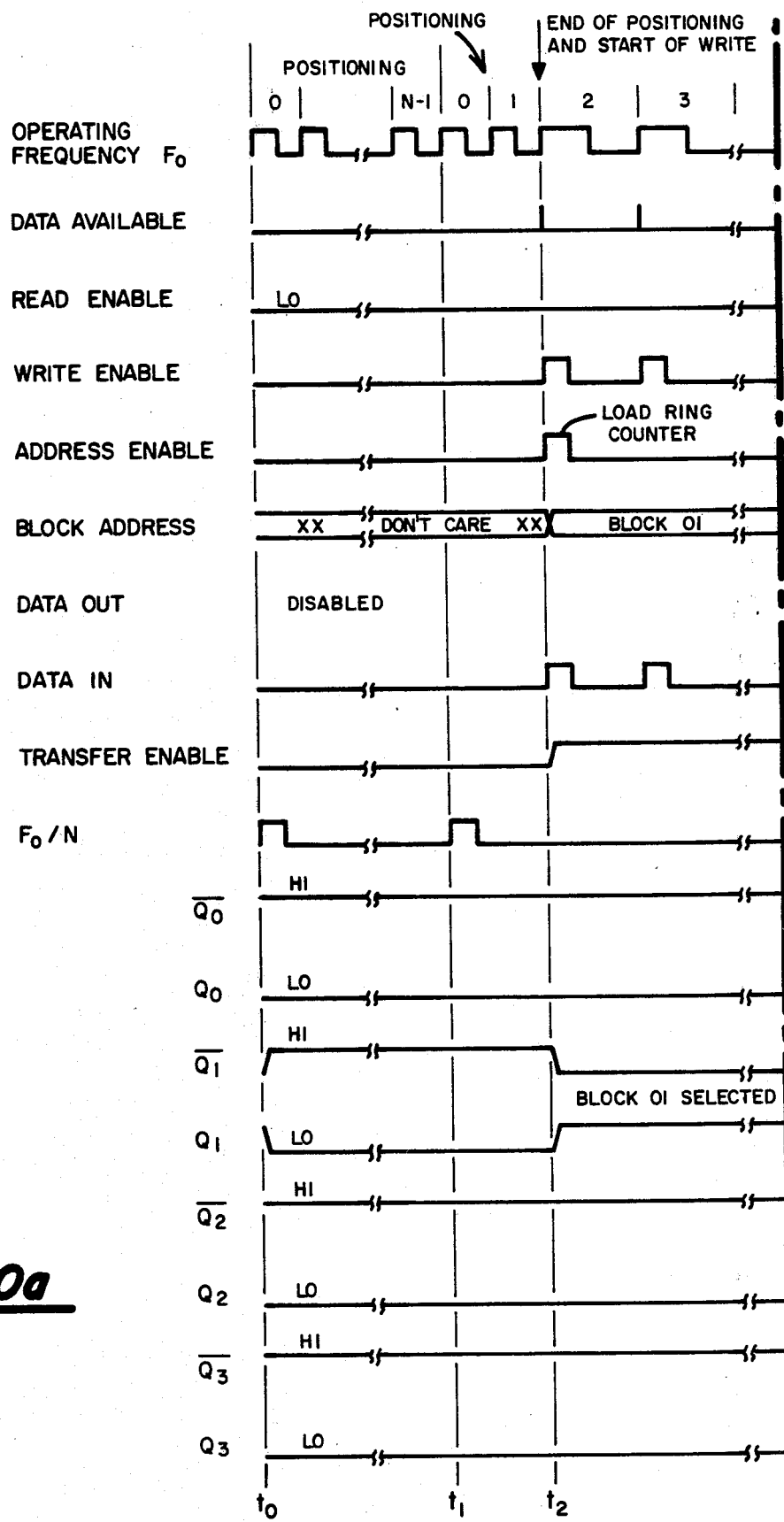
Figure 10B:
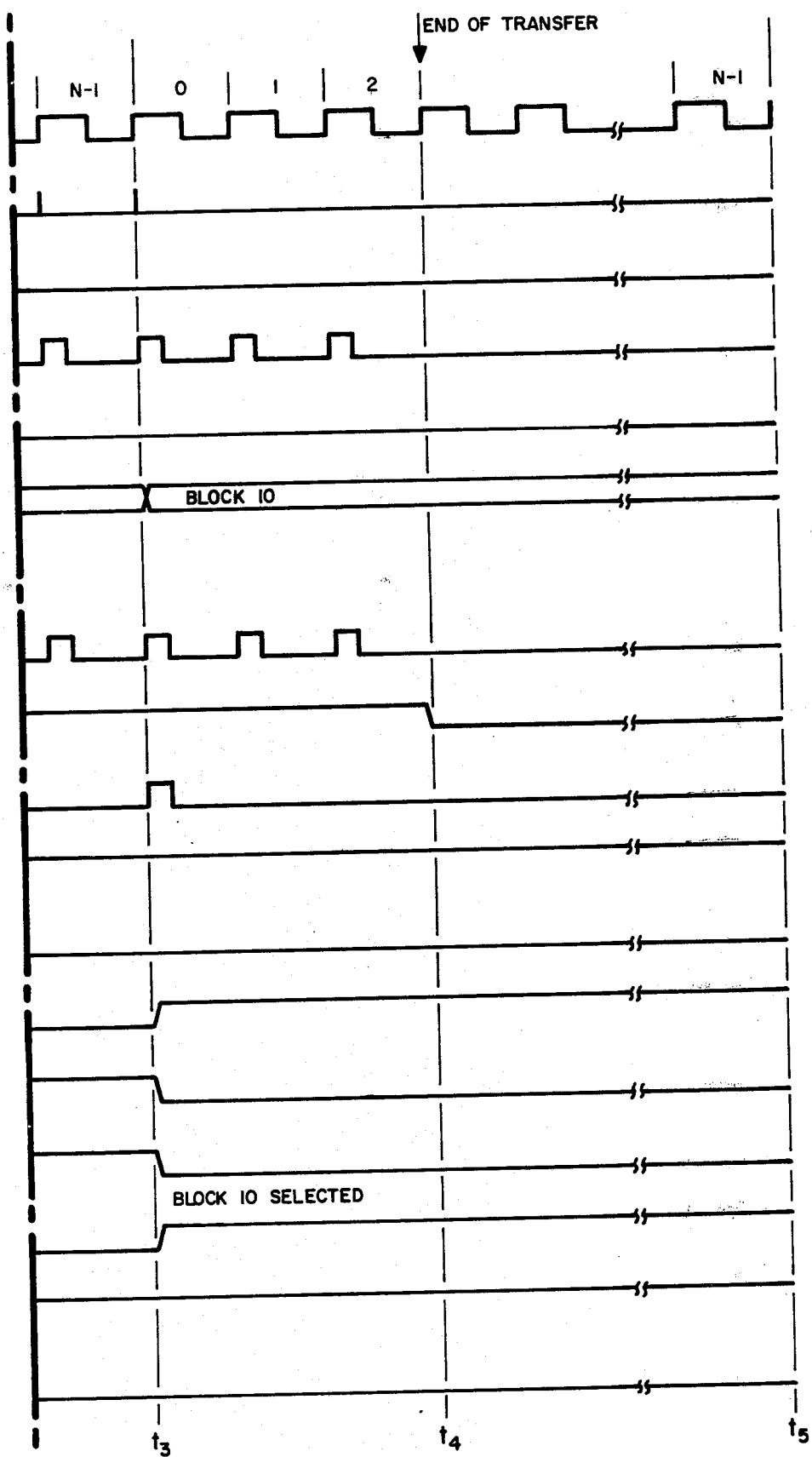
Figure 11A:
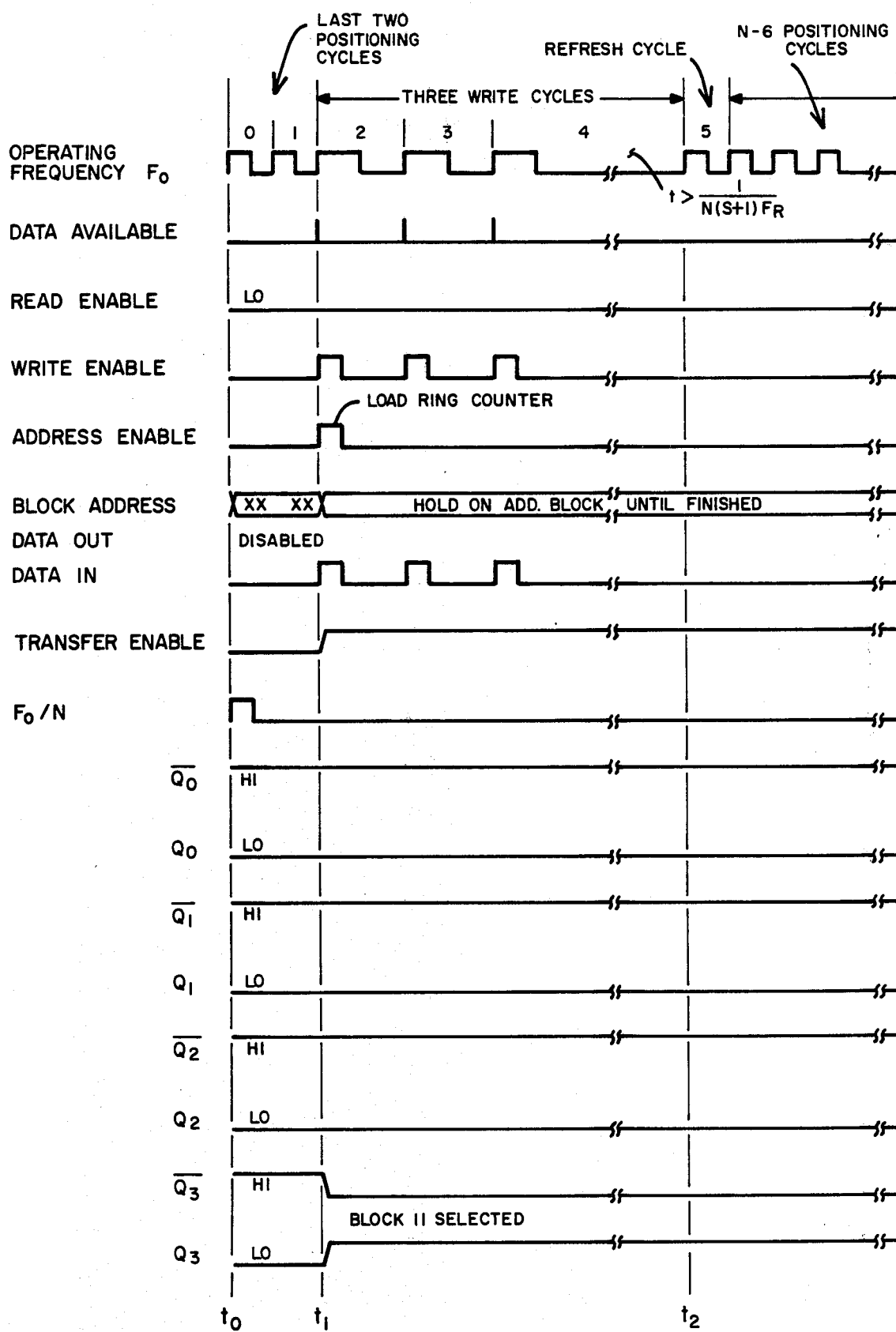
Figure 11B:
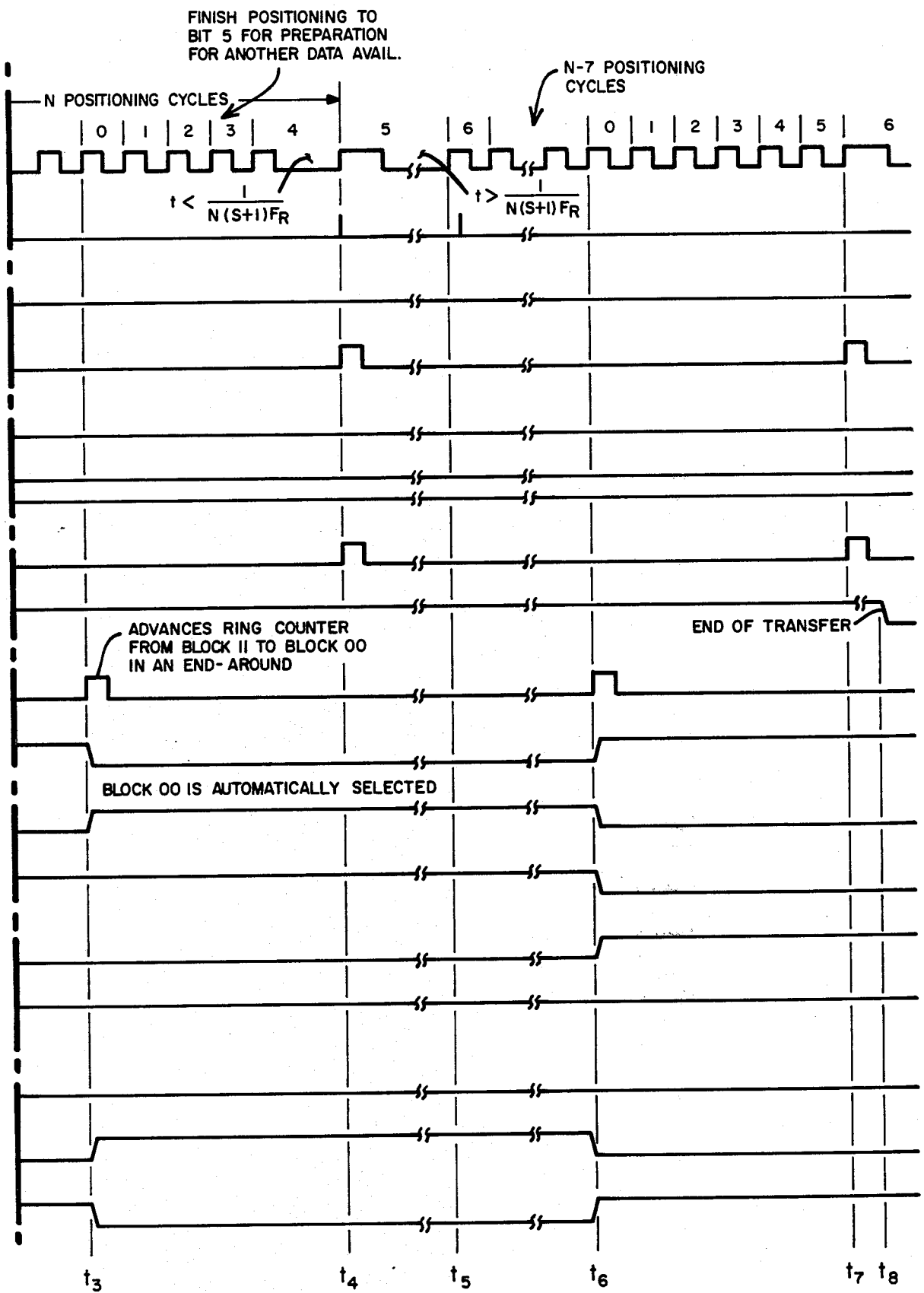

With particular reference to FIGS. 7 through 11 there are presented timing diagrams for the following series of operations of a memory system incorporating the present invention:

FIG. 7 is a timing diagram of a memory system being continuously refreshed until a Request signal initiates positioning of the starting address in the associated I/O register;

FIG. 8 is a timing diagram of a memory system being positioned at the starting address and then initiating a Read I/O operation;

FIG. 9 is a timing diagram of a memory system during a continuous series of read I/O operations interrupted by a refresh operation;

FIG. 10 is a timing diagram of a memory system being positioned at the starting address and then initiating a write I/O operation; and, FIG. 11 is a timing diagram of a memory system during a continuous series of write I/O operations interrupted by a refresh operation.

In an attempt to provide a meaningful discussion of a memory system incorporating the present invention, FIGS. 7 through 11 illustrate the operating characteristics of a memory system similar to that of FIG. 4, but in which the size thereof has been reduced. In the memory system illustrated by the timing diagrams of FIGS. 7 through 11

$B = 4$,
$N = 16$, and
$S = 7$.

Thus, in such memory system there are four ($B = 4$) memory blocks, each memory block including an input register, an output register and an I/O register each of 16 ($N = 16$) stages in length and 16 ($N = 16$) parallel registers each of 7 ($S = 7$) stages in length. Additionally, the:

first (serial) clock signal $F = 5.0$ Megahertz (MHz)
Second (parallel) clock signal $F/N = 312.5$ Kilohertz (KHz)

Maximum time duration permitted between refreshing of an electrical-charge-representing-bit by the charge sensor 22, 62 is that of $1/F_R = 10$ ms.

Refresh signal frequency (inverse of maximum time duration permitted between successive memory operations of: read; write; read, modify write; or refresh) $N(S+1)F_R = 12.8$ KHz.

With reference now to FIG. 7 there is illustrated the operation of a memory system that is initially, i.e., as at time $t_0$, between data transfers, i.e., between a series of read, write or read, modify write operations, such that it is being subjected to a continuous series of refresh operations. At such time: no memory block is being selected by block address decoder 102 such that, at each memory block AND/OR 68, AND 66 is being enabled and AND 64 is being disabled; starting address decoder 108 does not couple a Transfer Enable signal to line 112 such that, at each memory block, AND 60 is being disabled; and, write address decoder 106 couples its Hi $\overline{WE}$, Lo WE signals to the AND/OR 74 of each memory block. This allows the read data bits to be bit-serially transferred from the right-most stage of output register 16 into the left-most stage of input register 14 at the refresh frequency of $N(S+1)F_R$.

This series of refresh operations continues until, as at time $t_2$, the memory system is, via the receipt of a Data Request signal and a starting address from a requestor, switched to operate through a series of positioning cycles at the first clock signal frequency F. During this positioning operation, starting address decoder 108 continues comparing, at the first clock signal frequency F, the true address, on cable 110 from true address counter 90, to the starting address on cable 109. This positioning operation continues until block address decoder 102 selects the memory block in which the starting address lies by enabling AND 64 and disabling AND 66 of AND/OR 68 of the selected memory block, and starting address decoder 108 enables the associated AND 60 to bit-parallelly transfer the slice in output register 16 into the associated I/O register 52.

Because the memory system operates at differing frequencies as a function of its mode of operation, the frequency of operation or operating frequency is a varying frequency $F_0$. Note that block address decoder 102, when enabled by the Transfer Enable signal, which is generated by starting address decoder 108 when the starting address equals the true address, starts counting at the operating frequency $F_0$. At every N'th count or cycle of the operating frequency $F_0$, i.e., at the frequency $F_0/N$ ring counter 56 enables the next successively higher numbered two rail memory selection lines to select the next successively higher numbered memory block.

During the continuous series of refresh operations, as from time $t_0$ through $t_2$ the memory system is between data transfers and is in an idle or off-line condition. As discussed hereinabove, it is during this time that the memory system must be subjected to a refresh operation every $1/N(S+1)F_R$ second such that after $N(S+1)$ cycles every bit in a memory block has passed, from the associated output register 16, through charge sensor 22 to be refreshed prior to being coupled back into input register 14 via lines 55 and 70. All memory blocks are then being refreshed in parallel and are treated in an identical manner, i.e., all memory blocks are unselected. When a Data Request (Data Available) signal is received from a requestor and a series of read (write) operations is to be performed, as at time $t_2$, the memory system is placed in a positioning sequence and operates in a manner similar to the refresh operation, i.e., all memory blocks are unselected, except that the memory is operated at a faster speed or higher frequency such as at the first clock signal frequency F to minimize latency time. After the end of the higher speed positioning operations at the first clock signal frequency F the memory system is then ready to perform the designated read, write or read, modify write operation. Such read, write or read, modify write operation may be performed at the higher frequency F but is generally performed at a lower frequency $F_0$, as determined by the input/output conditions of the associated memory system controller and requesting requestor, e.g., 12.8 Khz $F_0$ MHz, where $F_0$ may typically be 1 MHz.

With reference now to FIG. 8 there is illustrated the operation of a memory system that is initially, i.e., as at time $t_0$, performing a positioning operation and that, as at time $t_2$, initiates a continuous series of read operations, all at a frequency that is equal to or greater than the refresh frequency $N(S+1)F_R$. FIG. 8 may be considered to be a continuation of FIG. 7, and, accordingly, at time $t_0$: no memory block is being selected by block address decoder 102 such that, at each memory block AND/OR 68, AND 66 is being enabled and AND 64 is being disabled; starting address decoder 108 does not couple a Transfer Enable signal to line 112 such that, at each memory block, AND 60 is being disabled; and, write block address decoder 106 couples its Hi $\overline{WE}$, Lo WE signals to the AND/OR 74 of each memory block. This allows the read data bits to be bit-serially transferred from the right-most stage of output register 16 into the left-most stage of input register 14 at the first clock signal frequency F.

This positioning operation continues until, as of time $t_2$, the positioning operation is terminated and the read operation is initiated at the selected memory block 1. During this positioning operation, as during the time $t_0$ through $t_2$, starting address decoder 108 continues comparing, at the first clock signal frequency F, the true address, on cable 110 from true address counter 90, to the desired starting address on cable 109. When the true address equals the starting address at time $t_2$, starting address decoder 108, via line 112, couples a Transfer Enable signal to AND 60 of the selected memory block 1, while concurrently, block address decoder 102, via the desired block address on cable 103 and the Transfer Enable signal on line 112a, selects memory block 1 in which the starting address lies by enabling AND 64 and disabling AND 66 of AND/OR 68 of the selected memory block via the two rail lines 124, 125 of cable 126. This then bit-parallelly transfers the slice in output register 16 into I/O register 52 of the selected memory block 1.

In the illustrated timing diagram of FIG. 8, the starting address is bit 3 of the read data slice, i.e., the fourth bit from the right, that was bit-parallelly transferred into the output register 16 of selected memory block 1 at time $t_1$. Thus, after three positioning cycles, i.e., at time $t_2$, after the first three bits in the three right-most bit positions of output register 16 have been shifted out and gated into the left-most bit position of input register 14, the contents (slice) of the output register 16 with the first 3 bit positions on the left end empty, is bit-parallelly transferred into the serial I/O register 52 with the starting address positioned in the right-most bit position of I/O register 52. At this time, at time $t_2$, the requesting requestor couples successive Data Request signals to the memory system which in turn generate and couple corresponding Read Enable signals to read enable line 114 which, via AND 130 and read block address decoder 104 gates out and couples onto Data Out line 128 the successive read data bits that are bit-serially being shifted out of the right-most stage of I/O register 52 while, concurrently, write block address decoder 106, via Hi $\overline{WE}$, Lo WE signals at AND/OR 74 of the selected memory block, bit-serially couples the read data bits of the read data slice in I/O register 52 into the left-most stages of I/O register 52 and input register 14 of the selected memory block 1.

At each operating signal frequency $F_0/N$ pulse, block address decoder 102 is incremented one block address such that successive read data slices from successively increasingly numbered memory blocks are bit-parallelly shifted from output register 16 of the newly selected memory block into the associated I/O register 52 from which the read data bits of the read data slices are bit-serially coupled to Data Out line 128 in the manner hereinabove described. If the last address of the last read data slice is not at the last bit position, i.e., bit position N-1 or the left-most bit position of the read data slice, the end-around circulation of the read data bits in I/O register 52 must continue until the last bit of the saved portion of the read data slice is recirculated into the left-most bit position of the input register 14. This operation is to save the bits of the read data slice that are a part of another data word that is formed by the next successive read data bits. Also note that in this read operation, as there are not refresh-positioning operations, the desired block address on cable 105 at read block address decoder 104 is incremented one count to maintain the same selected memory block address as is achieved by block address decoder 102.

With reference now to FIG. 9 there is illustrated the operation of a memory system that, at time $t_0$, initates the performance of a continuous series of read operations all at a frequency that is equal to or greater than refresh frequency $N(S+1)F_R$ and then, at time $t_1$, initiates a refresh operation followed by N-1 positioning operations. FIG. 9 may be considered to be a continuation of FIG. 7, and, accordingly, prior to time $t_0$: the memory system is in a positioning operation and no memory block is being selected by block address decoder 102 such that at each memory block AND/OR 68, AND 66 is being enabled and AND 64 is being disabled; starting address decoder 108 does not couple a Transfer Enable signal to line 112 such that, at each memory block, AND 60 is being disabled; and, write address block decoder 106 couples the Hi $\overline{WE}$, Lo WE signals to the AND/OR 74 of each memory block. This allows the read data bits to be bit-serially transferred from the right-most stage of output register 16 into the left-most stage of input register 14 at the first clock signal frequency F.

This positioning operation continues until, as of time $t_0$, the positioning operation is terminated and the read operation is initiated. During this positioning operation, prior to the time $t_0$, starting address decoder 108 continues comparing, at the first clock signal frequency F, the true address, on cable 110, from true address counter 90, to the desired starting address on cable 109. When the true address equals the starting address at time $t_0$, starting address decoder 108, via line 112, couples the Transfer Enable signal to AND 60 of the selected memory block 2, while concurrently block address decoder 102, via the desired block address on cable 103 and the Transfer Enable signal on line 112a, selects memory block 2 in which the starting address lies by enabling AND 64 and disabling AND 66 of AND/OR 68 of the selected memory block 2 via the two rail lines 124, 125 of cable 126. This then bit-parallelly transfers the slice in output register 16 into I/O register 52 of the selected memory block 2.

In the illustrated timing diagram of FIG. 9, the starting address is bit 0, i.e., the right-most bit of the read data slice which is bit-parallelly transferred into I/O register 52 at time $t_0$. At this time, at time $t_0$, the requesting requestor couples three successive Data Request signals to the memory system which signals, in turn, generate and couple corresponding Read Enable signals to read enable line 114 which, via AND 130 and read block address decoder 104, gates out and couples onto Data Out line 128 the successive read data bits that are bit-serially being shifted out of the right-most stage of I/O register 52 while, concurrently, write block address decoder 106, via Hi $\overline{WE}$, Lo WE signals at AND/OR 74 of the selected memory block 2, bit-serially couples the read data bits of the read data slice in I/O register 52 into the left-most stages of I/O register 52 and input register 14.

At this time, at time $t_2$, the memory system is subjected to a refresh operation at the refresh frequency $N(S+1)F_R$ in a manner as previously discussed with respect to FIG. 7 except that during this refresh operation a memory block is being selected. Accordingly, with respect to the unselected memory blocks, as at time $t_2$, the fourth data bit of each of the read data slices that are resident in each of the right-most bit positions of output register 16 is being shifted at the refresh frequency of $N(S+1)F_R$, back into the left-most bit position of the associated input register 14 as discussed hereinabove. With respect to the selected memory block 2, the fourth data bit of the read data slice that is resident in the right-most bit position of I/O register 52 is shifted, at the refresh frequency of $N(S+1)F_R$, back into the left-most bit position of both I/O register 52 and input register 14. Accordingly, and as discussed hereinabove, a refresh operation during a series of read operations has no apparent external effect upon the internal operation of the memory system, for both the selected memory block, at the associated I/O register 52, and the unselected memory blocks at the associated output registers 16 function as shift registers in the usual manner similar to the positioning operation when all memory blocks are unselected.

After the completion of the refresh operation, as at time $t_2$, the selected memory block 2, and also the unselected memory blocks, must now be subjected to N-4 positioning cycles at the first clock signal frequency F. This repositions the fourth bit of the read data slice, which is resident in I/O register 52 of memory block 2 that was selected at the time of the refresh operation, back into the right-most bit position I/O register 52 in preparation for the next read operation and the N-4 positioning cycles also shift data bits 4 through bit N-1 of the read data slice back into input register 14 for a data save of the N-4 bits in the read data slice before the block address decoder 102 advances at time $t_3$. Because each memory operation, i.e., such refresh, positioning, read, write or read, modify write operation, synchronously cycles all bits in all memory blocks, selected or unselected, after N memory operations, block address decoder 102, as at time $t_3$, is incremented one count—at the operation frequency $F_0/N$—to address or select the next successively numerically higher memory block.

Accordingly, at time $t_3$, block address decoder 102 unselects memory block 2 and selects memory block 3. However, because the read operation at the time of the refresh operation at time $t_2$ was reading out the read data bits of the read data slice that was resident in I/O register 52 of selected memory block 2 and even though at time $t_3$ memory block 2 is unselected and memory block 3 is selected the next and successive read operations, until the N bits have been read out, must be performed at memory block 2 while the next read data slice that is to be read out is, at time $t_3$, bit-parallelly transferred from output register 16 into the associated I/O register 52 of the newly selected memory block 3. Thus, it is apparent that a single refresh operation and the following necessary positioning operations must always advance the block address decoder 102 one memory block while the desired block address at read block address decoder 104 (or at write block address decoder 106) must be retained until the completion of the read (or write) operation. At that time the desired block address at read block address decoder 104 (or at write block address decoder 106) must be incremented one count to perform the associated read (or write) operation at the next successively numerically higher memory block.

After the completion of the positioning operations and the positioning of bit 3 of the read data slice in the right-most bit position of I/O register 52 of memory block 2, the Data Request signal, which may have been generated any time between $t_2$ and $t_4$—may now be honored by the generation and the coupling of a Read Enable signal on line 114. After the readout of bits 3 and 4 at times $t_4$ and $t_5$, the memory system is again subjected to a delay between read operations that exceeds the refresh cycle of $1/N(S+1)F_R$ seconds and a refresh operation is again performed at time $t_6$. As before, this is followed by a positioning operation of N-1 cycles to reposition, at time $t_8$, the next read data bit, bit 5, in the right-most bit position of I/O register 52. Upon the coupling of a Read Enable signal to line 114, bit 5 is read out and is coupled to Data Out line 128.

While undergoing the second refresh-positioning operation during times $t_6$ through $t_8$, at time $t_7$ block address counter 102 is again incremented one count at the frequency $F_0/N$ to unselect memory block 3 and select memory block 0. As before, the enabled AND 64 and AND 60 at the newly selected memory block 0 bit-parallelly transfer the read data slice that is resident in output register 16 into input register 14 and into I/O register 52 of the newly selected memory block $\phi$ to be retained therein as is the read data slice in the I/O register 52 of memory block 3 until it is to be read out in the manner as described hereinabove.

As discussed hereinabove, every refresh-positioning sequence increments the block address decoder 102 one count to select the next successively higher numbered memory block while the read block address decoder 104 or write block address decoder 106 are not incremented until the read/write operation upon the last bit of the slice is completed. When the I/O registers 52 and input registers 14 have been filled with the read data slices because of the plurality of refresh-positioning sequences, read counter 56 is cleared by a Counter Clear signal pulse to prevent over-write within the I/O registers 52. After that, data is continuously read out of the remaining I/O registers 52 in which the to-be-read-out data slices have been saved and have been recirculating through the I/O registers 52 in an end-around manner. Maximum latency time is N/F between any read cycle for the continuous read data bits at the first clock signal frequency F.

With reference now to FIG. 10 there is illustrated the operation of a memory system that is initially, i.e., as at time $t_0$, performing a positioning operation and that, as at time $t_2$, initiates a continuous series of write operations, all at a frequency that is equal to or greater than the refresh frequency $N(S+1)F_R$. FIG. 10 may be considered to be a continuation of FIG. 7, and, accordingly, at time $t_0$: no memory block is being selected by block address decoder 102 such that at each memory block AND/OR 68, AND 66 is being enabled and AND 64 is being disabled; starting address decoder 108 does not coupled a Transfer Enable signal to line 112 such that, at each memory block, AND 60 is being disabled; and, write block address decoder 106 couples its Hi $\overline{WE}$, Lo WE signals to the AND/OR 74 of each memory block. This allows the data bits to be bit-serially transferred from the right-most stage of output register 16 into the left-most stage of input register 14 at the first clock signal frequency F.

This positioning operation continues until, as of time $t_2$, the positioning operation is terminated and the write operation is initiated at the selected memory block 1. During this positioning operation, as during the time $t_0$ through $t_2$, starting address decoder 108 continues comparing, at the first clock signal frequency F, the true address, on cable 110 of true address counter 90, to the desired starting address on cable 109. When the true address equals the starting address at time $t_2$, starting address decoder 108 via line 112, couples a Transfer Enable signal to AND 60 of the selected memory block 1, while, concurrently, block address decoder 102, via the desired block address on cable 103 and the Transfer Enable signal on line 112a, selects memory block 1 in which the starting address lies by enabling AND 64 and disabling AND 66 of AND/OR 68 of the selected memory block via the two rail lines 124, 125 of cable 126. This then bit-parallelly transfer the data slice in output register 16 into I/O register 52 of the selected memory block 1.

In the illustrated timing diagram of FIG. 10, the starting address is bit 2 of the data slice, i.e., the third bit from the right, that was bit-parallelly transferred into input register 14 of selected memory block 1 at time $t_1$. Thus, after two positioning cycles, i.e., at time $t_2$, after the first two bits in the two right-most bit positions of input register 14 have been shifted out and gated into the left-most bit positions of input register the starting address is positioned in the right-most bit position of I/O register 52. At this time, at time $t_2$, the requesting requestor couples successive Data Available signals to the memory system which, in turn, generate and couple corresponding Write Enable signals to write enable line 116. These Write Enable signals on line 116 enable write block address decoder 106 via Lo $\overline{WE}$, Hi WE signals at AND/OR 74 of the selected memory block, to bit-serially couple the write data bits on Data In line 136 into the left-most stages of I/O register 52 and input register 14 of the selected memory block 1.

At each operating signal frequency $F_0/N$ pulse, block address decoder 102 is incremented one block address such that successive write data slices at successively higher numbered memory blocks are bit-serially shifted from Data In line 136 into the associated I/O registers 52 of the newly selected memory blocks. If the last address of the last write data slice is not at the last bit position, i.e., bit position N-1, or the left-most bit position of the data slice, the end-around circulation of the data bits in I/O register 52 must continue until the last bit of the saved portion of the read data slice is repositioned in the left-most bit position of I/O register 52. This operation is to save the bits of the read data slice that are a part of another data word that is formed by the next successive read data bits of the now modified read data slice. Also, note that as in this write operation there are no refresh-positioning operations the desired block address on cable 107 at write block address decoder 106 is incremented one count in synchronism with block address decoder 102 to maintain the same selected memory block address as is achieved by block address decoder 102.

With reference now to FIG. 11 there is illustrated the operation of a memory system that, at time $t_0$, is performing a positioning operation, that, at time $t_1$, initiates the performance of a continuous series of write operations, all at a frequency $F_0$ that is equal to or greater than the refresh frequency $N(S+1)F_R$, and that, at time $t_2$, initiates a refresh operation followed by N-1 positioning operations. FIG. 11 may be considered to be a continuation of FIG. 7, and, accordingly, prior to time $t_1$: the memory system is in a positioning operation and no memory block is being selected by block address decoder 102 such that in each memory block AND/OR 68, AND 66 is being enabled and AND 64 is being disabled; starting address decoder 108 does not couple at Transfer Enable signal to line 112 such that, at each memory block, AND 60 is being disabled; and, write address block decoder 106 couples the Hi $\overline{WE}$, Lo WE signals to the AND/OR 74 of each memory block. This allows the read data bits to be bit-serially transferred from the right-most stage of output register 16 into the left-most stage of input register 14 at the first clock signal frequency F.

This initial positioning operation, at time $t_0$, continues until, as of time $t_1$, the positioning operation is terminated and the write operation is initiated. During this positioning operation, prior to the time $t_1$, starting address decoder 108 continues comparing, at the first clock signal frequency F, the true address, on cable 110, from true address 90, to the desired starting address on cable 109. When the true address equals the starting address at time $t_1$, starting address decoder 108, via line 112, couples a Transfer Enable signal to AND 60 of the selected memory block 3, while, concurrently, block address decoder 102, via the desired block address on cable 103 and the Transfer Enable signal on line 112a, selects memory block 3 in which the starting address lies by enabling AND 64 and disabling AND 66 of AND/OR 68 of the selected memory block via the two rail lines 124, 125 of cable 126. This then bit-parallelly transfer the read data slice in output register 16 into I/O register 52 of selected memory block 3.

In the illustrated timing diagram of FIG. 11, the starting address is bit 2, i.e., the third bit from the right, that was bit-parallelly transferred into I/O register 52 at time $t_1$. Thus, after two positioning cycles, i.e., at time $t_1$, after the first two bits in the two right-most bit positions of output register 16 have been shifted out and gated into the left-most input register 14, the starting address is positioned in the right-most bit position of I/O register 52. At this time, at time $t_1$, the requesting requestor couples three successive Data Available signals to the memory system which signals, in turn, generate and couple corresponding Write Enable signals to write enable line 116. These Write Enable signals on line 116 enable write block address decoder 106, via Lo $\overline{WE}$, Hi WE signals at AND/OR 74 of the selected memory block, to bit-serially couple the write data bits on Data In line 136 into the left-most stages of I/O register 52 and input register 14 of the selected memory block 3.

At this time, at time $t_2$, the memory system is subjected to a refresh operation at the positioning frequency F in a manner as previously discussed with respect to FIG. 7 except that during this refresh operation a memory block is being selected. Accordingly, with respect to the unselected memory blocks, at a time $t_2$, bit 5 of each of the read data slices that are resident in each of the right-most bit positions of the output registers 16 is being shifted, at the positioning frequency of F, back into the left-most bit position of the associated input register 14 as disucssed hereinabove. With respect to the selected memory block 3, bit 5 of the read data slice that is resident in the right-most bit position of I/O register 52 is shifted, at the positioning frequency of F, back into the left-most bit position of both I/O register 16 and input register 14.

This read data bit 5, which at the refresh operation at time $t_2$ was shifted out of the right-most bit position of I/O register 52 into the left-most bit positions of I/O register 52 and input register 14, becaue no write data bit or end of transfer signal was available at time $t_2$, and must be considered a valid data bit that may belong to a different word and hence not to be altered by this write sequence. Accordingly, the read data bit 5 in input register 14 shall be saved and shifted through the associated memory block at the operating frequency $F_0$ in the normal manner and if a part of the present write sequence to be modified, upon completion of the write transfer operation, by the write data bit 5 that will be stored in bit position 5 of the write data slice in I/O register 52 upon completion of the next subsequent write operation at time $t_4$. Accordingly, and as discussed hereinabove, a refresh operation during a series of write operations has no apparent external effect upon the internal operation of the memory system, for both the selected memory block, at the associated I/O register 52, and the unselected memory blocks at the associated output registers 16 function as shift registers in the usual manner similar to the positioning operation when all memory blocks are unselected.

After the completion of the stretched write operation, as at time $t_2$, the selected memory block 3, and also the unselected memory blocks, must now be subjected to a refresh cycle and N-1 positioning cycles at the first clock signal frequency F. Note: refresh cycle will be done at F to position bit 5 in minimum time. This repositions bit 5 of the read data slice, which is resident in I/O register 52 of memory block 3 that was selected at the time of the refresh operation, back into the right-most bit position of I/O register 52 in preparation for the next write operation. Because each memory operation, i.e., each refresh, positioning, read, write or read, modify write operation, synchronously cycles all bits and all memory blocks, selected or unselected, after N memory operations, block address decoder 102, as at time $t_3$, is incremented one count—at the operating frequency F0/N—to address or select the next successively numerically higher memory block.

Accordingly, at time $t_3$, block address decoder 102 unselects memory block 3 and selects memory block 0. However, because the write operation at the time of the refresh operation at time $t_2$ was writing into the read data bit of the read data slice that was resident in I/O register 52 of selected memory block 3 and even though at time $t_3$ memory block 3 is unselected and memory block 0 is selected, the next and successive write operations, of the N write data bits that are to be written into memory block 3 must be performed at memory block 3 while the next read data slice that is to be read out and is then to be modified during the next subsequent write operations, is, at time $t_3$, bit-parallelly transferred from output register 16 into the associated I/O register 52 of memory block 0. Thus, it is apparent that a single refresh operation and the following necessary positioning operations must always advance the block address decoder 102 one memory block while the desired block address at the write block address decoder 106 must be retained until the completion of the necessary write operations at the associated memory block. At that time the desired block address may be incremented one count to perform the associated write operations at the next successively higher numbered memory block.

After the completion of the positioning operations and the positioning of bit 5 of the read data slice into the right most bit position of I/O register 52 of memory block 3, the Data Available signal, which may have been generated any time between $t_2$ and $t_4$, may now be honored by the generation and the coupling of a Write Enable signal on line 116. After the writing of bit 5 at time $t_4$, the memory system is again subjected to a delay between write operations that exceeds the refresh cycle of $1/N(S+1)F_R$ seconds and a refresh operation is again performed at time $t_5$. As before, this is followed by a positioning operation of N-1 cycles to reposition, at time $t_7$, the next read data bit, bit 6, in the right-most bit position of I/O register 52. Upon the coupling of a Write Enable signal on line 116, bit 6 of the write data on Data In line 136 is written into the left-most bit position of I/O register 52 and input register 14 of memory block 3.

While undergoing the second refresh and positioning operations during times $T_5$ through $t_7$, at time $t_6$ block address decoder 102 is again incremented one count at the operating frequency $F_0/N$ to unselect memory block 0 and select memory block 1. As before, the enabled AND 60 at the newly selected memory block 1 bit-parallelly transfers the read data slice resident in output register 16 into I/O register 52 to be retained therein as is the read data slice in I/O register 52 of memory block 0 until it is to be modified by the write operation in the manner that is described hereinabove.

As discussed hereinabove, every refresh-positioning sequence increments the block address decoder 102 one count to select the next successively higher numbered memory block while the write block address decoder 106 is not incremented until the write operation upon the last bit of the current write data slice is completed. When the I/O registers 52 have been filled with write data because of the plurality of refresh-positioning sequences, ring counter 56 is cleared by a Counter Clear signal pulse on line 120 to prevent over-write within I/O registers 52. After that, write data is sequentially read out of the I/O registers 52 in which the to-be-written write data have been saved and have been recirculating through the I/O registers 52 in an end-around manner to be written into and modify the saved bits in the corresponding input registers 14 at the completion of the write transfer operation. Maximum latency time for this operation is N continuous data bits at the first clock signal frequency F after completion of the write transfer operation.

Figure 12:
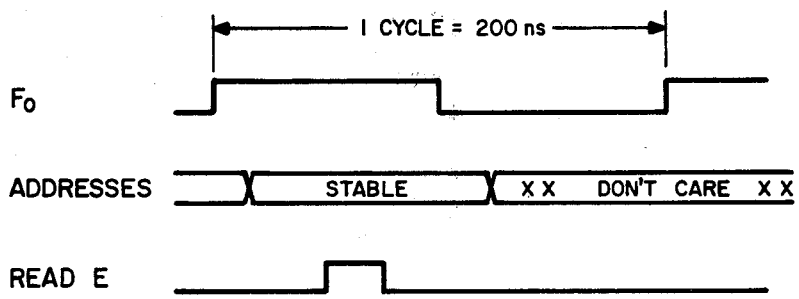
FIG. 12 is an illustration of the exemplary timing relations of the frequency, addressing and function signal relationships.
Figure 13:
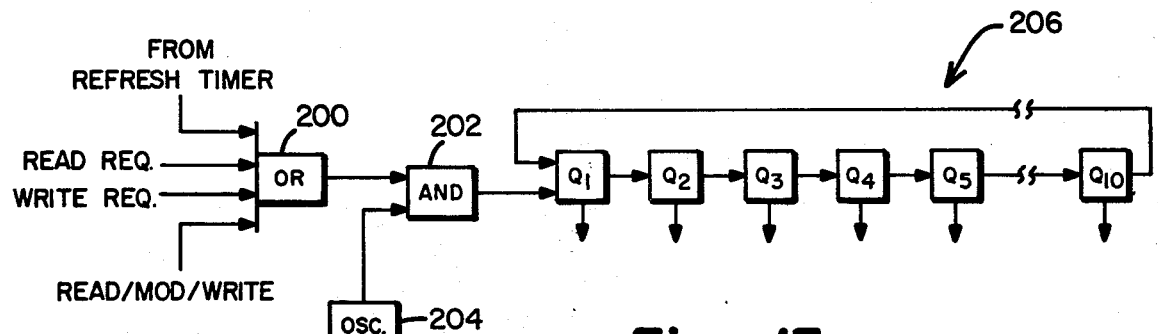
FIG. 13 is an illustration of an exemplary apparatus for generating the necessary control signals for the system of FIG. 4.
Figure 14:
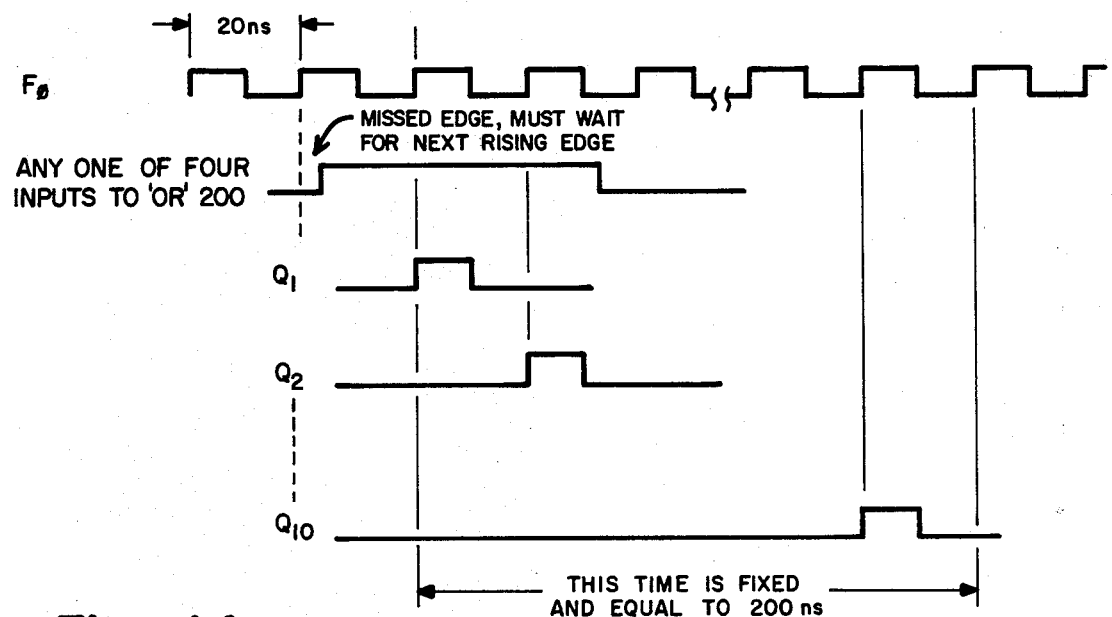
FIG. 14 is an illustration of the exemplary timing relations of the memory system of FIG. 4 as implemented by the timing chain of FIG. 13.

With respect to FIGS. 12, 13 and 14, there are presented drawings relating to an exemplary scheme for generating the variable operating frequency $F_0$. Using a frequency F of one cycle equal to, e.g., 200 nanoseconds (ns) whereby $1/F = 1/200 \times 10^{-9}$ sec. $= 5$ MegaHertz (MHz). FIG. 12 illustrates a timing diagram exemplifying frequency, addressing and function signal relationships. FIG. 13 illustrates a means for generating the necessary control signals in which the noted signals are ORed at OR 200, the output of which at AND 202 enables oscillator 204 to drive a ten phase timing chain 206.

FIG. 14 illustrates exemplary timing relationships of the memory system of FIG. 4 as implemented by the timing chain of FIG. 13. Timing for the memory system 100 of FIG. 4 is provided by selecting the desirable phase from the timing chain 206 of FIG. 13. As an example: the fast clock of frequency F as established by oscillator 204 may rise with phase 01 and fall with phase 06; the Read Enable signal of FIG. 12 may rise with phase 02 and fall with phase 04; address selection may rise with phase 02 and fall with phase 07, etc. In the timing chain 206, the feedback connection from phase 010 to phase 01 is utilized to prevent the start of a second cycle while the first cycle is being executed, e.g., a read cycle 30 ns after the start of a refresh cycle. In the illustrated example the inverse of the variable frequency $F_0$ would be from $1/F = 200$ ns (the length of the timing chain given phase 010 to phase 01 feedback) through 200 ns $+ W \times 20$ ns (where 20 ns is the inverse of the oscillator 24 frequency $F_0$ and W is a positive integer of one or more.):

$$1/F_R = 200 \text{ ns} + W \times 20 \text{ ns} \quad 1/F_0 \quad 1/F = 200 \text{ ns}$$
As an example:
$$1/F_0 = 200 \text{ ns} = 1/F$$
$$= 220$$
$$= 240$$
$$= 260$$
up to $= N(S+1)F_R =$ refresh frequency in steps of 20 ns.

It is apparent that the present invention provides an organization of serial-parallel-serial (SPS) charged-coupled-device (CCD) memory arrays or blocks into a memory system that provides an improved operating memory system. The addition of the serial shift I/O register to the previously well-known SPS CCD memory arrays enables the system designer to utilize a larger capacity memory while providing substantially reduced latency time.

Figure 15:
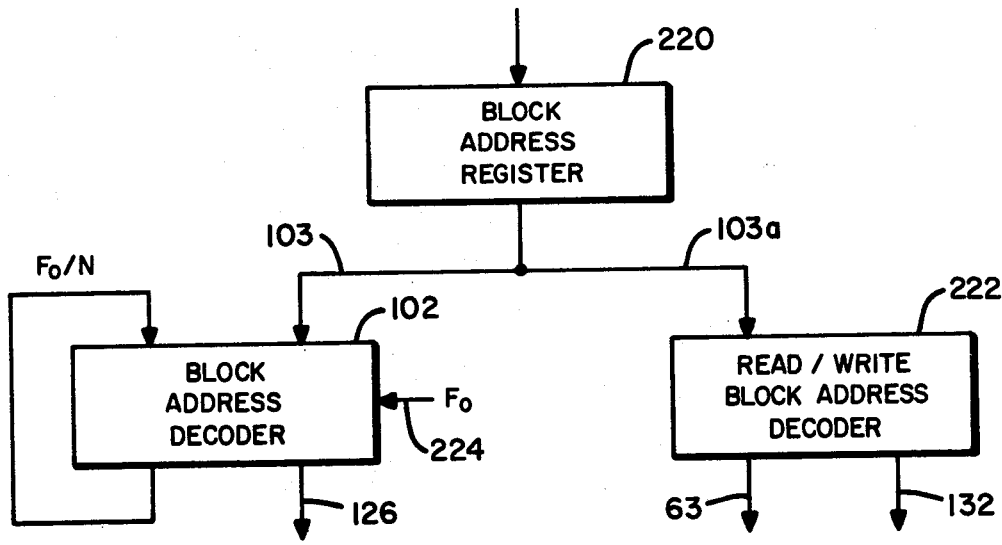

With particular reference to FIG. 15 there is illustrated a schematic block diagram of a method of implementing the block address decoding/incrementing scheme of the present invention. In the system of FIG. 4 and as previously discussed hereinabove, block address decoder 102 follows true address counter 90 whereby the block address on cable 103 is incremented one block address for every N: read; write; read, modify write; position; refresh; reposition, cycles. However, and as discussed hereinabove, read block address decoder 104 and write block address decoder 106 are incremented one block address for only every N: read; write; and read, modify write cycles. This is because block address decoder 102 keeps pace with true address counter 90 while read block address decoder 104 and write block address decoder 106 do not. For every N times a memory block is affected by a memory operation that causes the bits stored therein to be shifted N bit positions in the input register and the output register or the I/O register, a memory slice is shifted in parallel through the parallel registers and into the output register or the I/O register via cable 126 and the selected AND/OR 63. In contrast, read block address decoder 104 and write block address decoder 106 are not affected by the refresh, reposition, position cycles so that they are incremented one block count only upon N consecutive read; write; and read, modify write cycles.

In the block diagram of FIG. 15, block address register 220 receives and holds the desired block address. The desired block addres, via cable 103, is coupled to block address decoder 102 and, via cable 103a, is coupled to read/write block address decoder 222. Via line 224, block address decoder is incremented one bit count for every N read; write; read, modify write; position; refresh; and reposition cycle while, in contrast, via line 103a, read/write block address decoder 222 is incremented one bit count for every block address increment from the block address register which is after every N write and read, modify write cycles. That is, whenever the system of FIG. 4 is affected by a refresh, reposition sequence the decoded address from block address decoder 102 advances ahead of the decoded address from read/write block address decoder 222 and, accordingly, read address decoder 104 and write address decoder 106.

What is claimed is:

1. In an SPS CCD memory block comprised of an N-stage input register means, N S-stage parallel register means and an N-stage output register means in which data bits are bit-serially shifted into said input register means, are bit-parallelly shifted out of the input register means into and through said N parallel register means and then into said output register means to be bit-serially shifted back into said input register means, the improvement comprising:
    an N stage I/O register means;
    a data-in selector means;
    a memory block selector means, the output of which is coupled to said input register means;
    an I/O register transfer means for bit-parallelly selectively coupling the data bits that are stored in said output register means to said I/O register means;
    output register transfer means for bit-serially coupling the data bits that are stored in said output register means to said memory block selector means;
    write data bit source means;
    data-in selector means coupled to said I/O register means and to said write data bit source means for bit-serially coupling the data bits that are stored in said I/O register means to said memory block selector means and to said I/O register means or, alternatively, coupling the write data bits, which are provided by said write data bit source means, to said memory block selector means and to said I/O register means; and, memory block address decoder means coupled to said memory block selector means alternatively selecting or not selecting the memory block for bit-serially coupling, to said input register means, the data bits that are coupled to said memory block selector means by said data-in selector means or, alternatively, coupling the data bits that are coupled to said memory block selector means by said output register transfer means.

2. An SPS CCD memory block, comprising:
serial shift input register means having N stages;
serial shift output register means having N stages;
serial shift I/O register means having N stages;
serial shift N parallel register means, each having S stages;
first transfer means for separately coupling each of the N stages of said input register means to a separate associated first stage of each of said N parallel register means;
second transfer means for separately coupling the last stage of each of said N parallel register means to a separate associated one of the N stages of said output register means;
third transfer means for selectively coupling each of the N stages of said output register means to a separate associated one of the N stages of said I/O register means;
memory block selector means;
data-in selector means;
first charge sensor means for coupling the right-most stage of said output register means to said memory block selector means;
second charge sensor means for coupling the right-most stage of said I/O register means to said data-in selector means;
means for coupling said data-in selector means to the left-most stage of said I/O register means and to said memory block selector means;
means for coupling said memory block selector means to the left-most stage of said input register means;
transfer enable means coupled to said third transfer means for bit-parallelly transferring the data bits in the N stages of said output register means to the corresponding stages of said I/O register means; and,
means coupled to said memory block selector means for bit-serially coupling the data bits from the right-most stage of said output register means or, alternatively, from the right-most stage of said I/O register means to the left-most stage of said input register means.

3. The SPS CCD memory block of claim 2 further including:
write data bit source means coupled to said data-in selector means; and,
write block address decoder means coupled to said data-in selector means for bit-serially gating through said data-in selector means the data bits from the right-most stage of said I/O register means or, alternatively, the write data bits that are provided by said write data bit source means.

4. The SPS CCD memory block of claim 3 further including:
read block address decoder means coupled to the output of said second set of sensor means for bit-serially reading out the data bits that are stored in said I/O register means.

5. A SPS CCD memory system, comprising:
B SPS CCD memory blocks, each comprising:
input register means having N stages;
N parallel register means, each having S stages;
output register means having N stages;
I/O register means having N stages;
memory block selector means, the output of which is coupled to said input register means;
data-in selector means;
I/O transfer means;
output register sensor means for coupling said output register means to said memory selector means;
I/O register sensor means for coupling said I/O register means to said data-in selector means;
means for coupling said data-in selector means to said I/O register means and to said memory block selector means;
I/O register transfer means for enabling the transfer of the data bits that are stored in said output register means into said I/O register means;
data-in means coupled to said data-in selector means for coupling write data bits thereto;
block address decoder means coupled to each of the B memory block selector means of said B memory blocks and selecting one of said B memory blocks for enabling the transfer of the data bits that are stored in the I/O register means or, alternatively, enabling the transfer of the data bits that are stored in the output register means of the selected memory block into the associated input register means;
write block address decoder means coupled to each of the B data-in selector means of the B memory blocks and selecting one of said B memory blocks for alternatively enabling the transfer of the data bits that are stored in said I/O register means or the write data bit that are provided by said data-in means into said I/O register means and also into said input register means via the memory selector means of the selected memory block;
read block address decoder means coupled to the common terminal of the I/O register sensor means and the data-in selector means of each of the B memory blocks for selectively reading out the data bits that are stored in the I/O register means of the selected memory block; and,
starting address decoder means comparing a fixed desired starting address to a changing true address and coupling a transfer enable signal to the I/O register transfer means of the selected memory block in which said starting address lies for transferring the data bits that are stored in the output register means of the selected memory block into the associated I/O register means.

6. In an SPS CCD memory system that is comprised of B, where B is a positive integer of 2 or greater, SPS CCD memory blocks, each of said B memory blocks comprised of N S-stage parallel register means, an N-stage input register means, each stage of which is coupled to the first stage of an associated one of said N parallel register means, and an N-stage output register means, each stage of which is coupled to the last stage of an associated one of said N parallel register means, and in which the data bits that are stored in the N(S+1) bit positions of said input register means and of said N parallel register means of each of said B memory blocks are cycled through each of said B memory blocks at a varying operating frequency $F_0$, the method of the operation of said memory system comprising:

coupling, within each of said B memory blocks, each stage of said N-stages of said output register means to a corresponding stage of an N-stage input/output register means; and, alternatively coupling the data bits that are held in said output register means or that are held in said input/output register back to said input register means for recirculation through the associated one of said B memory blocks.

7. In an SPS CCD memory system that is comprised of B, where B is a positive integer of 2 or greater, SPS CCD memory blocks, each of said B memory blocks comprised of N S-stage parallel register means, an N-stage input register means, each stage of which is coupled to the first stage of an associated one of said N parallel register means, and an N-stage output register means, each stage of which is coupled to the last stage of an associated one of said N parallel register means, and in which the data bits that are stored in the N(S+1) bit positions of said input register means and of said N parallel register means of each of said B memory blocks are cycled through each of said B memory blocks at a varying operating frequency $F_0$, the method of the operation of said memory system comprising:

selecting one of said B memory blocks for coupling the data bits that are held in the associated output register means to an associated input/output register means and thence to the associated input register means for recirculation through said selected one of said B memory blocks; and, simultaneously non-selecting the other ones of said B memory blocks for coupling the data bits that are held in the associated output register means directly to the associated input register means for recirculation through said non-selected other ones of said B memory blocks.

8. In the method of claim 7 further comprising:

selecting successive ones of said B memory blocks for coupling the data bits, which data bits are held in each associated input/output register of each of said successively selected ones of said B memory blocks and that form a serial string of data bits that comprise a data slice, to a data-out line.

9. In the method of claim 7, further including:

simultaneously coupling write data bits to the first stages of the associated input/output register means and input register means during the selection of each of said successively selected ones of said B memory blocks; and, continuously circulating said write data bits through the associated input/output register means of said successively selected ones of said B memory blocks at least until all said continuously circulating write data bits have been stored in the associated input register means.

10. In an SPS CCD memory system that is comprised of B, where B is a positive integer of 2 or greater, SPS CCD memory block, each of said B memory blocks comprised of N S-stage parallel register means, an N-stage input register means, each stage of which is coupled to the first stage of an associated one of said N parallel register means, and an N-stage output register means, each stage of which is coupled to the last stage of an associated one of said N parallel register means, and in which the data bits that are stored in the N(S+1) bit positions of said input register means and of said N parallel register means of each of said B memory blocks are cycled through each of said B memory blocks at a varying operating frequency $F_0$, the method of the operation of said memory system comprising:

selecting successive ones of said B memory blocks for simultaneously coupling, at a varying operating frequency $F_0$, write data bits from a data-in line to the first stages of the output register means and an associated input/output register means of each of said successively selected ones of said B memory blocks;

simultaneously non-selecting the other ones of said B memory blocks for coupling the data bits that are held in the associated output register means directly to the associated input register means for recirculation through said non-selected other ones of said B memory blocks; and, simultaneously cycling said B memory blocks through one refresh cycle at a frequency $N(S+1)F_R$ followed by N-1 positioning cycles at a frequency F for end-around shifting the write data bits held in the input/output register means of said selected one of said B memory blocks.

11. In an SPS CCD memory block comprised of an N-stage input register means, N S-stage parallel register means and an N-stage output register means in which data bits are bit-serially shifted into said input register means, are bit-parallelly shifted out of the input register means into and through said N parallel register means and then into said output register means, the improvement comprising:

an N-stage I/O register means;

means for coupling each of the stages of said output register means to a corresponding stage of said I/O register means;

means intercoupling the first and last stages of said I/O register means for performing an end-around shift of the data bits held therein; and, memory block selector means coupling the last stages of said output register means and said I/O register means to the first stage of said input register means for simultaneously coupling the data bits held in said output register means to said input register means and end-around shifting the data bits held in said I/O register means, or, alternatively, for coupling the data bits held in said I/O register means to said input register means.

12. In an SPS CCD memory block comprised of an N-stage input register means, N S-stage parallel register means and an N-stage output register means in which data bits are bit-serially shifted into said input register means, are bit-parallelly shifted out of the input register means into and through said N parallel register means and then into said output register means, the improvement comprising:

an N-stage I/O register means;

means for coupling each of the stages of said output register means to a corresponding stage of said I/O register means;

read/write selector means coupling the last stages of said output register means and said I/O register means to the first stage of said input register means for coupling the read data bits held in said output register means to said input register means, or, alternatively, for coupling the write data bits held in said I/O register means to said input register means.

13. The SPS CCD memory block of claim 12 wherein said read/write selector means includes data-in selector means for coupling the write data bits held in said I/O register means to said input register means, or, alternatively, coupling the write data bits from a data-in line to said input register means.

14. The SPS CCD memory block of claim 13 wherein said read/write selector means includes means coupling said data-in selector means to the first stage of said I/O register means for coupling the write data bits held in said I/O register means for an end-around shift.

* * * * *